(12) United States Patent
Yeh

(10) Patent No.: US 10,775,674 B2
(45) Date of Patent: Sep. 15, 2020

(54) PIXEL STRUCTURE AND MANUFACTURING METHOD THEREOF

(71) Applicant: HANNSTAR DISPLAY CORPORATION, Taipei (TW)

(72) Inventor: Cheng-Yen Yeh, Taichung (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 16/006,859

(22) Filed: Jun. 13, 2018

(65) Prior Publication Data

US 2019/0107760 A1    Apr. 11, 2019

(30) Foreign Application Priority Data

Oct. 10, 2017  (CN) .......................... 2017 1 0932293

(51) Int. Cl.
| | |
|---|---|
| G02F 1/1362 | (2006.01) |
| H01L 27/12 | (2006.01) |
| G02F 1/1343 | (2006.01) |
| H01L 49/02 | (2006.01) |
| G02F 1/1368 | (2006.01) |
| G02F 1/1333 | (2006.01) |
| G02F 1/1337 | (2006.01) |

(52) U.S. Cl.
CPC ...... *G02F 1/136213* (2013.01); *G02F 1/1368* (2013.01); *G02F 1/13439* (2013.01); *G02F 1/133345* (2013.01); *G02F 1/136227* (2013.01); *H01L 27/1248* (2013.01); *H01L 27/1255* (2013.01); *H01L 27/1262* (2013.01); *H01L 28/60* (2013.01); *G02F 1/133707* (2013.01); *G02F 2201/40* (2013.01); *H01L 27/124* (2013.01); *H01L 27/1225* (2013.01)

(58) Field of Classification Search
CPC ......... G02F 1/136213; G02F 1/133345; G02F 1/13439; G02F 1/1368; H01L 27/1255; H01L 27/1262; H01L 28/60; H01L 27/124; H01L 27/1225
See application file for complete search history.

(56) References Cited

U.S. PATENT DOCUMENTS

| | | | | |
|---|---|---|---|---|
| 2012/0268396 A1* | 10/2012 | Kim | ....................... | G06F 3/0412 345/173 |
| 2015/0145821 A1* | 5/2015 | Kim | ....................... | G06F 3/0412 345/174 |

FOREIGN PATENT DOCUMENTS

| | | |
|---|---|---|
| CN | 102750024 A | 10/2012 |
| CN | 104679321 A | 6/2015 |

* cited by examiner

*Primary Examiner* — Patricia D Reddington
(74) *Attorney, Agent, or Firm* — Winston Hsu

(57) ABSTRACT

A pixel structure includes a thin film transistor, a first insulating layer, a first transparent conductive layer, a second insulating layer, a connecting hole and a second transparent conductive layer. The thin film transistor is disposed on the substrate, and the thin film transistor includes a gate, a source and a drain. The first insulating layer, the first transparent conductive layer and the second insulating layer are disposed on the thin film transistor in sequence, and the first transparent conductive layer includes a pixel electrode. The connecting hole exposes a portion of the pixel electrode and a portion of the drain. The second transparent conductive layer is disposed on the second insulating layer, the second transparent conductive layer includes a common electrode and a connecting electrode electrically insulated to the common electrode, and the connecting electrode extends into the connecting hole.

18 Claims, 20 Drawing Sheets

PIXEL STRUCTURE AND MANUFACTURING METHOD THEREOF

CROSS REFERENCE TO RELATED APPLICATION

This application claims the priority benefit of China application serial No. 201710932293.0, filed Oct. 10, 2017. The entirety of the above-mentioned patent application is hereby incorporated by reference herein and made a part of this specification.

BACKGROUND OF THE INVENTION

1. Field of the Invention

The present invention relates to a pixel structure and a manufacturing method of a pixel structure, and more particularly to a pixel structure and a manufacturing method of a pixel structure for increasing a capacitance of a storage capacitor.

2. Description of the Prior Art

A conventional display device is composed of two substrates and layers with various electronic components disposed between the substrates to display images. Since such a display device has the characteristics of thin appearance, low power consumption and no radiation pollution, it has been widely used in many kinds of portable or wearable electronic products, such as notebooks, smart phones, watches, and display devices in vehicles, for transmitting and displaying information more conveniently.

In order to enhance the resolution of the display device, a size of a pixel of the display device would be shrunk, such that a number of the pixels would be increased under the condition that the size of the display device is not changed. However, as the size of the pixel is shrunk, the overlapping area of a common electrode and a pixel electrode of the pixel would be decreased, which make a capacitance of a storage capacitor formed of the common electrode and the pixel electrode be insufficient, such that electrical characteristics of the storage capacitor and a display quality of the display device are affected. Therefore, maintaining or improving the electrical characteristics of the storage capacitor needs to be achieved under the condition of enhancing the resolution of the display device.

SUMMARY OF THE INVENTION

The present invention provides a pixel structure and a manufacturing method of a pixel structure for making a distance between a common electrode and a pixel electrode decrease without affecting other loads by a film and connecting hole design of the pixel, so as to increase a capacitance of a storage capacitor formed of the common electrode and the pixel electrode.

In order to solve the above problems, the present invention provides a pixel structure including a thin film transistor, a first insulating layer, a first transparent conductive layer, a second insulating layer, a connecting hole and a second transparent conductive layer. The thin film transistor is disposed on the substrate, and the thin film transistor includes a gate, a source and a drain. The first insulating layer is disposed on the thin film transistor. The first transparent conductive layer is disposed on the first insulating layer, and the first transparent conductive layer includes a pixel electrode. The second insulating layer is disposed on the first insulating layer and the first transparent conductive layer. The connecting hole exposes a portion of the pixel electrode and a portion of the drain. The second transparent conductive layer is disposed on the second insulating layer, the second transparent conductive layer includes a common electrode and a connecting electrode, the connecting electrode extends into the connecting hole, and the connecting electrode is electrically insulated to the common electrode, wherein the connecting electrode is electrically connected to the drain and the pixel electrode.

In order to solve the above problems, the present invention further provides a manufacturing method of the pixel structure including following steps. A thin film transistor is formed on a substrate, and the thin film transistor includes a gate, a source and a drain. A first insulating layer is formed on the thin film transistor. A first transparent conductive layer is formed on the first insulating layer, and the first transparent conductive layer includes a pixel electrode. A second insulating layer is formed on the first transparent conductive layer and the first insulating layer. Then, a portion of the first insulating layer and a portion of the second insulating layer are removed for forming a connecting hole, and the connecting hole exposes a portion of the pixel electrode and a portion of the drain. A second transparent conductive layer is formed on the second insulating layer, the second transparent conductive layer includes a common electrode and a connecting electrode, the connecting electrode is electrically insulated to the common electrode, and the connecting electrode extends into the connecting hole, wherein the connecting electrode is electrically connected to the pixel electrode and the drain.

In the pixel structure of the display device of the present invention, since the first insulating layer is disposed between the pixel electrode and the second conductive layer including the data line, the drain and the source, and the second insulating layer is disposed between the pixel electrode and the common electrode, the capacitance of the storage capacitor formed of the pixel electrode and the common electrode may be enhanced by reducing the thickness of the second insulating layer, and the possibility of the metal puncture and the load between the data line and the common electrode may be decreased by increasing the thickness of the first insulating layer. Accordingly, the electrical characteristics of the storage capacitor can be enhanced, or the adverse effect is reduced while increasing the resolution. On the other hand, the connecting hole of the present invention is in the first insulating layer and the second insulating layer and exposes a portion of the pixel electrode and a portion of the drain, and therefore, the connecting hole for electrically connecting the pixel electrode to the drain may be formed by one etching process only. Furthermore, when the common electrode is formed, the connecting electrode extending into the connecting hole and being electrically connected to the pixel electrode and the drain is formed simultaneously, so as to reduce the cost of the manufacture. Moreover, the size of the connecting electrode and the overlapping between the pixel electrode and the drain may be shrunk to enhance the aperture ratio of the pixel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
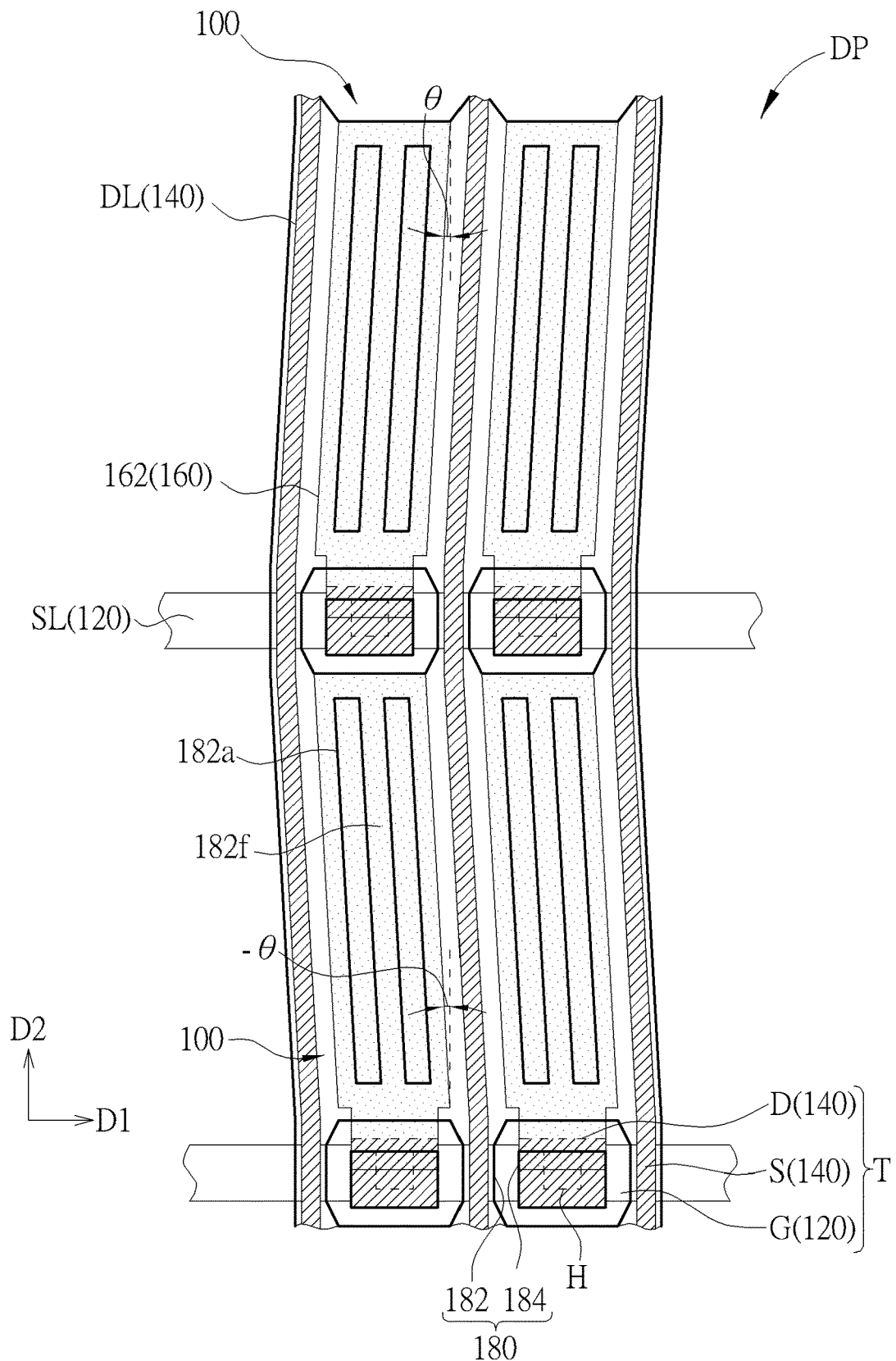
FIG. 1 is a top-view schematic diagram illustrating a portion of a display device of a first embodiment of the present invention.

To provide a better understanding of the present invention to those skilled in the art, preferred embodiments will be detailed in the follow description. The preferred embodiments of the present invention are illustrated in the accompanying drawings with numbered elements to elaborate on the contents and effects to be achieved. It should be noted that the drawings are simplified schematics, and therefore show only the components and combinations associated with the present invention, so as to provide a clearer description for the basic structure or implementing method of the present invention. The components would be more complex in reality. In addition, for ease of explanation, the components shown in the drawings may not represent their actual number, shape, and dimensions; details may be adjusted according to design requirements.

Figure 2:
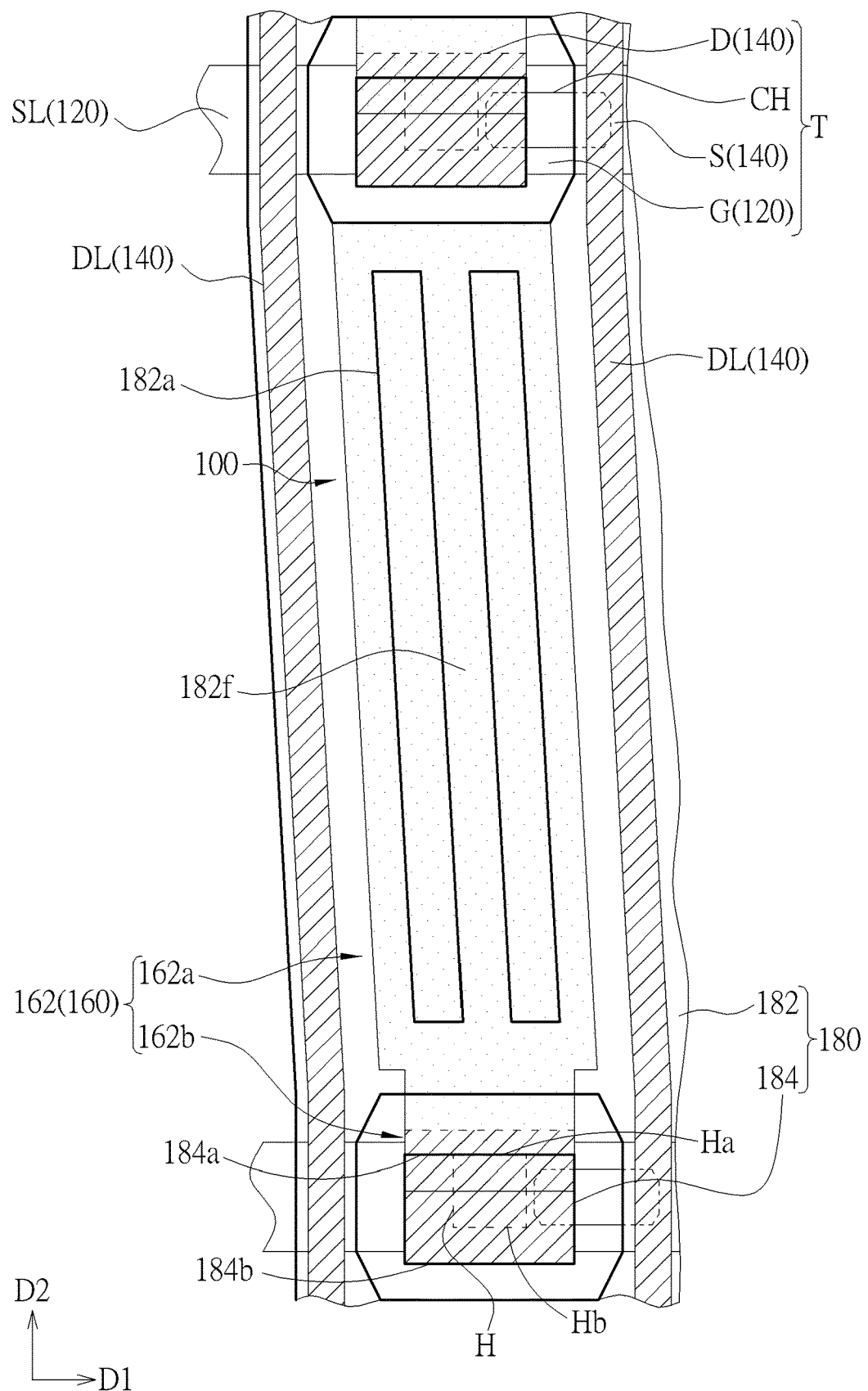
FIG. 2 is a top-view schematic diagram illustrating a pixel structure of the first embodiment of the present invention.
Figure 3:
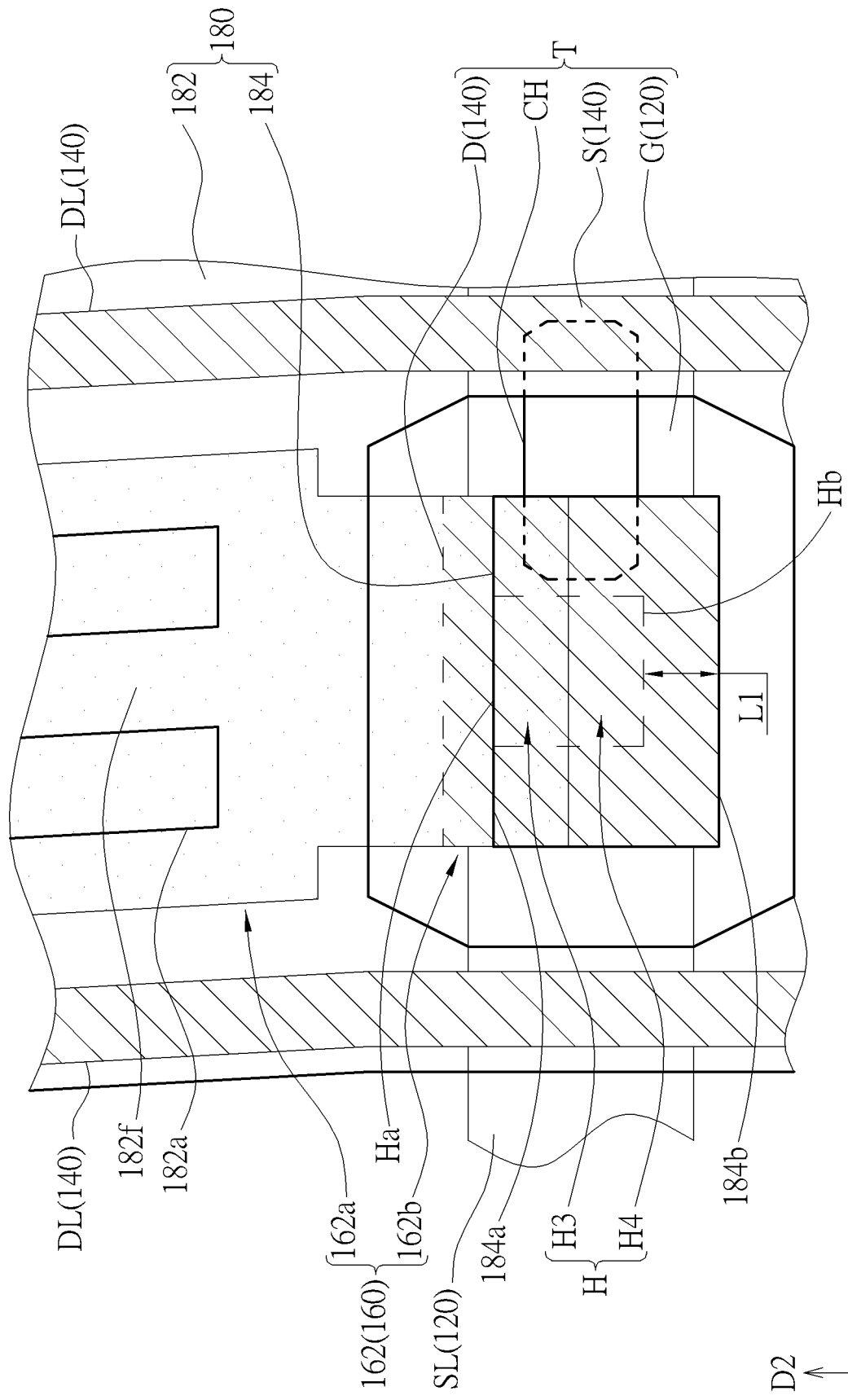
FIG. 3 is a partial enlarged schematic diagram of FIG. 2.
Figure 4:
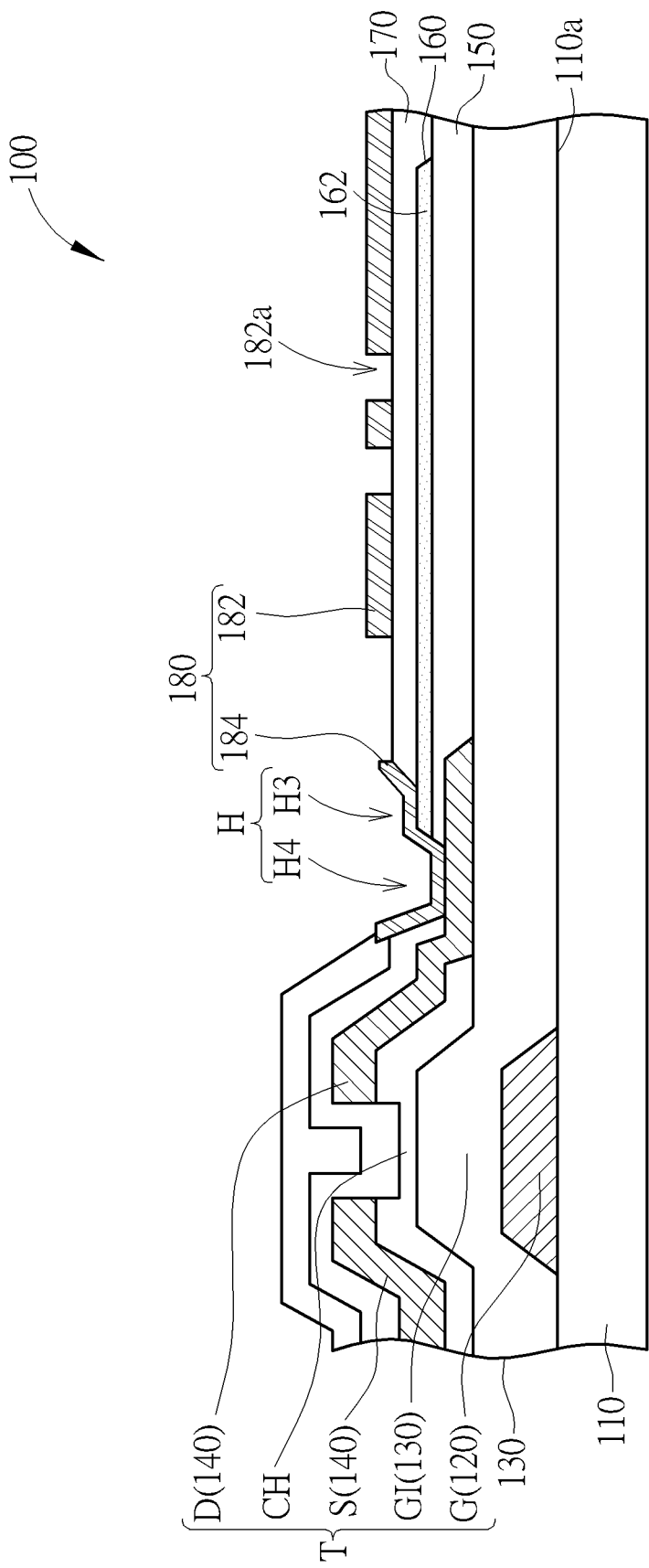
FIG. 4 is a cross-sectional view schematic diagram illustrating the pixel structure of the first embodiment of the present invention.

Referring to FIG. 1 to FIG. 4, FIG. 1 is a top-view schematic diagram illustrating a portion of a display device of a first embodiment of the present invention, FIG. 2 is a top-view schematic diagram illustrating a pixel structure of the first embodiment of the present invention, FIG. 3 is a partial enlarged schematic diagram of FIG. 2, and FIG. 4 is a cross-sectional view schematic diagram illustrating the pixel structure of the first embodiment of the present invention. The display device DP is a liquid crystal display device for example, but the invention is not limited thereto. As shown in FIG. 1, the display device DP of this embodiment includes a plurality of pixel structures 100 arranged in an array. The pixel structures 100 may be arranged in a plurality of rows extending along a first direction D1, and the rows may be arranged along a second direction D2 to form a pixel array, wherein the pixel structures 100 may form a plurality of columns extending along the second direction D2, and the first direction D1 are not parallel to the second direction D2. The first direction D1 of this embodiment is perpendicular to the second direction D2, but the invention is not limited thereto. In this embodiment, a top-view shape of the pixel structure 100 is a shape like a parallelogram. In detail, the shape of the pixel structure 100 may be the parallelogram having two sides parallel to the first direction D1 and another two sides not parallel to the first direction D1 and the second direction D2. For example, in the two adjacent rows, each of the another two sides of the pixel structure 100 in one of the rows has a positive included angle θ with the second direction D2, and each of the another two sides of the pixel structure 100 in another row have a negative included angle −θ with the second direction D2; that is to say, the parallelogram of the pixel structures 100 in two adjacent rows are not the same, but they are symmetrical to an imaginary line parallel to the first direction D1. Therefore, two adjacent pixel structures 100 in the second direction D2 are arranged as "<" shape or ">" shape, and the pixel structures 100 in the second direction D2 form serpentine columns, but the invention is not limited thereto. In another embodiment, the shape of the pixel structure 100 may be rectangular, "<" shape, ">" shape or other suitable shape, and the pixel structures 100 may be arranged depending on requirements; for example, when the shape of the pixel structure 100 is rectangular, the pixel structures 100 may be arranged in a plurality of rows extending along the first direction D1, and arranged in a plurality of columns extending along the second direction D2, but the invention is not limited thereto. In still another embodiment, the adjacent rows or the adjacent columns may be misaligned. In addition, in this embodiment, scan lines SL and data lines DL utilized for transmitting signals may intersect to define pixel regions. The scan lines SL and the data lines DL are electrically connected to thin film transistors T of the corresponding pixel structures 100, and the scan lines SL cross the data lines DL and electrically insulated to the data lines DL. For example, the scan lines SL may extend along the first direction D1 and be arranged in parallel in the second direction D2, the data lines DL may approximately extend along the second direction D2 and be arranged in parallel in the first direction D1, but the disposition of the scan lines SL and the data lines DL is not limited thereto. Furthermore, each of the pixel structures 100 may be a sub-pixel of the display device DP, and one pixel is formed of a plurality of the sub-pixels, such as one pixel is formed of three sub-pixels and serves as a display unit.

As shown in FIG. 1 to FIG. 4, the pixel structure 100 of this embodiment includes a thin film transistor T, a first insulating layer 150, a first transparent conductive layer 160, a second insulating layer 170, a connecting hole H and a second transparent conductive layer 180. The substrate 110 is utilized for carrying components of the pixel structure 100, and the substrate 110 has a surface 110a. The substrate 110 may be a rigid substrate such as a glass substrate, a plastic substrate, a quartz substrate or a sapphire substrate, or a flexible substrate including polyimide (PI) or polyethylene terephthalate (PET) for example, but the invention is not limited thereto.

The thin film transistor T is disposed on the surface 110a of the substrate 110, and the thin film transistor T includes a gate G, agate insulating layer GI, a source S, a drain D and a semiconductor layer CH. In this embodiment, a first conductive layer 120 is disposed on the substrate 110, a third insulating layer 130 is disposed on the first conductive layer 120, and a second conductive layer 140 is disposed on the third insulating layer 130. The first conductive layer 120 includes the gate G of the thin film transistor T, the second conductive layer 140 includes the source S and the drain D of the thin film transistor T, and the third insulating layer 130 includes the gate insulating layer GI between the gate G and the semiconductor layer CH. Thus, the thin film transistor T of this embodiment may be a bottom-gate thin film transistor, but the invention is not limited thereto. The thin film transistor T of another embodiment may be a top-gate thin film transistor. In this embodiment, the scan lines SL are utilized for transmitting control signals to renew frames, and the data lines DL are utilized for transmitting control signals of display gray levels, wherein the scan lines SL may be formed of the first conductive layer 120 and electrically connected to the gate G of the thin film transistor T, and the data lines DL may be formed of the second conductive layer 140 and electrically connected to the source S of the thin film transistor T, but the invention is not limited thereto. Furthermore, the first conductive layer 120 and the second conductive layer 140 may include conductive material with good conductivity, such as metal material.

The first insulating layer 150 is disposed on the thin film transistor T, and the first transparent conductive layer 160 is disposed on the first insulating layer 150. That is to say, the first insulating layer 150 is utilized for separating the first transparent conductive layer 160 from the second conductive layer 140. The first insulating layer 150 maybe a single-layer structure or a multi-layer structure. The first transparent conductive layer 160 may include a pixel electrode 162 disposed in the pixel structure 100, and the pixel electrode 162 is electrically connected to the drain D of the thin film transistor T. The second insulating layer 170 is disposed on the first insulating layer 150 and the first transparent conductive layer 160, and the second transparent conductive layer 180 is disposed on the second insulating layer 170. That is to say, the second insulating layer 170 is utilized for separating the second transparent conductive layer 180 from the first transparent conductive layer 160. The second insulating layer 170 may be a single-layer structure or a multi-layer structure. The second transparent conductive layer 180 may include a common electrode 182 partially overlapping the pixel electrode 162 in a vertical projection direction perpendicular to the surface 110a of the substrate 110, so the pixel structure 100 of this embodiment has the common electrode 182 disposed on the pixel electrode 162. Note that the common electrodes 182 of two adjacent pixel structures 100 disposed in the first direction D1 or in the second direction D2 maybe connected to each other, such that at least a portion of the common electrodes 182 of the pixel structures 100 are electrically connected together. For example, the common electrodes 182 of all of the pixel structures 100 may be electrically connected together and are supplied with a common voltage, or the common electrodes 182 of all of the pixel structures 100 maybe divided into a plurality of groups, the common electrodes of each group are electrically connected together and supplied with a corresponding common voltage, and the common electrodes of any two of the groups are isolated from each other. In addition, the common electrode 182 has a plurality of slits 182a and at least one strip electrode 182f situated between two adjacent slits 182a, such that an electrical field is generated between the common electrode 182 and the corresponding pixel electrode 162 to control rotation of liquid crystal molecules. With this arrangement, when the thin film transistor T is turned on, the control signal of the display gray level transmitted by the data line DL maybe transmitted to the pixel electrode 162, such that the liquid crystal molecules may be controlled by the electrical field generated between the pixel electrode 162 and the corresponding common electrode 182 to display the display gray level of the frame depending on the control signal of the display gray level. Moreover, the pixel electrode 162 of this embodiment may have a first portion 162a and a second portion 162b connected to each other. In this description, a portion of the pixel electrode 162 overlapping the drain D in the vertical projection direction is defined as the second portion 162b, and a portion of the pixel electrode 162 without overlapping the drain D in the vertical projection direction is defined as the first portion 162a, wherein the vertical projection direction is perpendicular to the surface 110a of the substrate 110 (the definition of the vertical projection direction in the following description is the same, and will therefore not be repeated). Furthermore, the first insulating layer 150 and the second insulating layer 170 may include silicon dioxide, silicon nitride or silicon oxynitride, and the first transparent conductive layer 160 and the second transparent conductive layer 180 may include indium tin oxide (ITO) or indium zinc oxide (IZO), but the invention is not limited thereto.

In a display device having a conventional design which has the common electrode disposed on the pixel electrode, since the pixel electrode, the data line and the drain and the source of the thin film transistor are separated from the common electrode by only one insulating layer, a distance between the pixel electrode and the common electrode is reduced due to the decrease of the thickness of the insulating layer when a capacitance of a storage capacitor formed of the pixel electrode and the common electrode needs to be increased under the condition that a size of pixel do not increase, or when a capacitance of a storage capacitor formed of the pixel electrode and the common electrode needs to be approximately the same under the condition that a size of pixel is reduced. However, because a distance between the data line and the common electrode is decreased, such that a parasitic capacitance between the data line and the common electrode is increased and the capacitance loading of the data line is increased. Furthermore, when the insulating layer is thinner, a possibility of a short circuit phenomenon would be increased owing to metal penetration through the insulating layer. In the present invention, since the first insulating layer 150 is disposed between the pixel electrode 162 and the second conductive layer 140 including the data lines DL and the drain D and the source S of the thin film transistor T, and the second insulating layer 170 is disposed between the pixel electrode 162 and the common electrode 182, the capacitance of the storage capacitor formed of the pixel electrode 162 and the common electrode 182 may be enhanced by reducing a thickness of the second insulating layer 170, and the parasitic capacitance between the data lines DL and the common electrode 182 may be decreased by increasing a thickness of the first insulating layer 150. Accordingly, the possibility of the short circuit phenomenon would be decreased, and the capacitance of the storage capacitor may be increased or the adverse effect incidental to increasing the resolution may be reduced. For example, in the display device with high pixel density (high ppi) of which the common electrode 182 is disposed on the pixel electrode 162, because a width of the strip electrode 182f and a width of the slit 182a of the common electrode 182 may not be further shrunk as the area of the pixel structure 100 is shrunk due to the limit of process technology (such as the exposure step and the development step of the photo process (photolithography)), the number of the strip electrodes 182f and the number of the slits 182a situated within one pixel structure 100 are decreased when an area of the pixel structure 100 is shrunk. Accordingly, an overlapping area of the pixel electrode 162 and the common electrode 182 in the vertical projection direction is decreased. According to the pixel structure 100 of the present invention, if the pixel density is increased, although the overlapping area of the pixel electrode 162 and the common electrode 182 is reduced, the capacitance of the storage capacitor may be maintained or only slightly changed, and the parasitic capacitance between the data lines DL and the common electrode 182 may be reduced simultaneously by adjusting the thickness and material of the first insulating layer 150 and the thickness and material of the second insulating layer 170. As shown in FIG. 1 to FIG. 3, the common electrode 182 has two slits 182a and one strip electrode 182f within one of the pixel structures 100, but the invention is not limited thereto. In another embodiment, the common electrode 182 may have three slits 182a and two strip electrodes 182f within one of the pixel structures 100, wherein each of the strip electrodes 182f is respectively situated between two adjacent slits 182a. When the area of the pixel structure 100 is smaller, and therefore the number of the slits 182a and the number of the strip electrodes 182f of the common electrode 182 within in one of the pixel structures 100 are decreased (such as the common electrode has three slits 182a and two strip electrodes 182f within one of the pixel structures 100 or has two slits 182a and one strip electrode 182f within one of the pixel structures 100), the present invention solves the problems of the capacitance of the storage capacitor being too small and the load being too high, but the number of the slits 182a and the number of the strip electrodes 182f of the common electrode 182 within in one of the pixel structures 100 are not limited thereto.

Moreover, in the present invention, in order to make the pixel electrode 162 be electrically connected to the drain D of the thin film transistor T, the connecting hole H of the pixel structure 100 of this embodiment is situated in the first insulating layer 150 and the second insulating layer 170, and the connecting hole H exposes a portion of the pixel electrode 162 and a portion of the drain D. that is to say, the connecting hole H overlaps a portion of the pixel electrode 162 and a portion of the drain D in the vertical projection direction. In addition, the second transparent conductive layer 180 further includes a connecting electrode 184 electrically insulated from the common electrode 182, and the connecting electrode 184 extends into the connecting hole H to be in contact with the drain D and the pixel electrode 162, so as to be electrically connected to the drain D and the pixel electrode 162. Note that a projection area of the connecting electrode 184 projecting on the surface 110a of the substrate 110 of this embodiment is greater than a projection area of the connecting hole H on the surface 110a of the substrate 110 (as shown in FIG. 3), but the invention is not limited thereto. In detail, after forming the second insulating layer 170 and before forming the second transparent conductive layer 180, the connecting hole H is formed by etching the first insulating layer 150 and the second insulating layer 170 through an etching process, such that the first insulating layer 150 and the second insulating layer 170 do not cover the portion of the pixel electrode 162 and the portion of the drain D of the thin film transistor T. In other words, the connecting hole H includes a third portion H3 and a fourth portion H4. The third portion H3 exposes the portion of the pixel electrode 162; that is, the third portion H3 is formed by removing a portion of the second insulating layer 170, such that the second insulating layer 170 does not cover the pixel electrode 162 in the third portion H3 of the connecting hole H. The fourth portion H4 exposes the portion of the drain D; that is, the fourth portion H4 is formed by removing a portion of the first insulating layer 150 and a portion of the second insulating layer 170, such that the first insulating layer 150 and the second insulating layer 170 do not cover the drain D in the fourth portion H4 of the connecting hole H. After the connecting hole H is formed, the second transparent conductive layer 180 is formed, such that the connecting electrode 184 extends into the connecting hole H to be in contact with and electrically connected to the drain D and the pixel electrode 162. In other words, the pixel electrode 162 is electrically connected to the drain D of the thin film transistor through the connecting electrode 184. As shown in FIG. 3 and FIG. 4, in this embodiment, the third portion H3 of the connecting hole H exposes at least a portion of the second portion 162b of the pixel electrode 162, but the invention is not limited thereto. In addition, in the vertical projection direction, the pixel electrode 162 and the drain D of this embodiment overlap in the third portion H3, and the first insulating layer 150 is situated between the pixel electrode 162 and the drain D in the third portion H3, such that the connecting hole H has a good cross-sectional shape to avoid disconnection of the connecting electrode 184 filled in the connecting hole H. Furthermore, the pixel electrode 162 and the drain D overlap in the third portion H3 in the vertical projection direction may shrink the size of the connecting hole H, so as to increase the effective display area of the pixel structure 100 for enhancing the luminance, but the invention is not limited thereto. In this embodiment, in order to make the electrical connection between the pixel electrode 162 and the drain D through the connecting electrode 184 be better, an area (projection area) of the connecting hole H may be greater than or equal to twice of an area (projection area) of the third portion H3, and the area of the connecting hole H is preferably twice to three times of the area of the third portion H3, and in other words, an area of the pixel electrode 162 exposed by the connecting hole H is preferably ⅓ to ½ of the area of the connecting hole H, but the disposition of the connecting hole H is not limited thereto.

The connecting hole H has the third portion H3 exposing the pixel electrode 162 and the fourth portion H4 exposing the drain D, and the pixel electrode 162 and the drain D are electrically connected to each other through the connecting electrode 184, so a length of the connecting electrode 184 of this embodiment may be less than ½ of the connecting electrode of the conventional design of which two etching holes respectively expose the pixel electrode and the drain, and the connecting electrode extends into the etching holes to electrically connect the pixel electrode to the drain. In other words, if the connecting hole H and the connecting electrode 184 of this embodiment form a connecting structure, and two conventional etching holes and a conventional connecting electrode form a conventional connecting structure, a length of the connecting structure of this embodiment may be less than ½ of a length of the conventional connecting structure, and an aperture ratio of the pixel may be increased, thereby enhancing the luminance. In this embodiment, a maximum length of the connecting hole H may range from about 2 μm to about 7 μm, and a size of the connecting electrode 184 maybe adjusted depending on the size of the connecting hole H and the range of process offset error. For instance, when the maximum length of the connecting hole H is about 2 μm, a maximum length of the connecting electrode 184 (such as the length of the connecting electrode 184 along the first direction D1 shown in FIG.

3) maybe about 8 µm; when the maximum length of the connecting hole H is about 7 µm, the maximum length of the connecting electrode 184 may be about 13 µm; that is to say, the maximum length of the connecting electrode 184 may range from about 8 µm to about 13 µm, but the invention is not limited thereto. In this embodiment, the third portion H3 of the connecting hole H may be situated at a side of the fourth portion H4, the area (projection area) of the connecting electrode 184 is greater than the area (projection area) of the connecting hole H, the connecting hole H overlaps a portion of the connecting electrode 184 in the vertical projection direction, and the other portion of the connecting electrode 184 surrounds the connecting hole H. With this disposition, even if an undercut phenomenon occurs in the first insulating layer 150 under the pixel electrode 162 during the etching process for forming the connecting hole H, which results in the break of the connecting electrode 184 in the connecting hole H, the pixel electrode 162 can be electrically connected to the drain D through the connecting electrode 184 surrounding the connecting hole H, and thus, electrically disconnection between the pixel electrode 162 and the drain D is avoided. The invention is not limited thereto.

Furthermore, the connecting electrode 184 may have a first edge 184*a* and a second edge 184*b*, the first edge 184*a* is an edge of the connecting electrode 184 having a shortest distance from the first portion 162*a* of the pixel electrode 162 in the second direction D2 (an edge of the connecting electrode 184 closest to the first portion 162*a*), the second edge 184*b* is an edge of the connecting electrode 184 having a longest distance from the first portion 162*a* of the pixel electrode 162 in the second direction D2 (an edge of the connecting electrode 184 furthest to the first portion 162*a*), and the first edge 184*a* is situated between the second edge 184*b* and the first portion 162*a*. The connecting hole H has a third edge Ha and a fourth edge Hb, the third edge Ha is an edge of the connecting hole H having a shortest distance from the first portion 162*a* of the pixel electrode 162 in the second direction D2 (an edge of the connecting hole H closest to the first portion 162*a*), the fourth edge Hb is an edge of the connecting hole H having a longest distance from the first portion 162*a* of the pixel electrode 162 in the second direction D2 (an edge of the connecting hole H furthest to the first portion 162*a*), and the third edge Ha is situated between the fourth edge Hb and the first portion 162*a*. For example, the connecting electrode 184 and the connecting hole H of this embodiment maybe rectangular, and therefore, the first edge 184*a* and the second edge 184*b* are two opposite sides of the connecting electrode 184 in the second direction D2, and the third edge Ha and the fourth edge Hb are two opposite sides of the connecting hole H in the second direction D2, but the invention is not limited thereto. The shape of the connecting electrode 184 and the shape of the connecting hole H may be designed depending on a requirement, such as they may be circular, or the shape of the connecting electrode 184 and the shape of the connecting hole H may be different types of shapes.

Figure 5A:
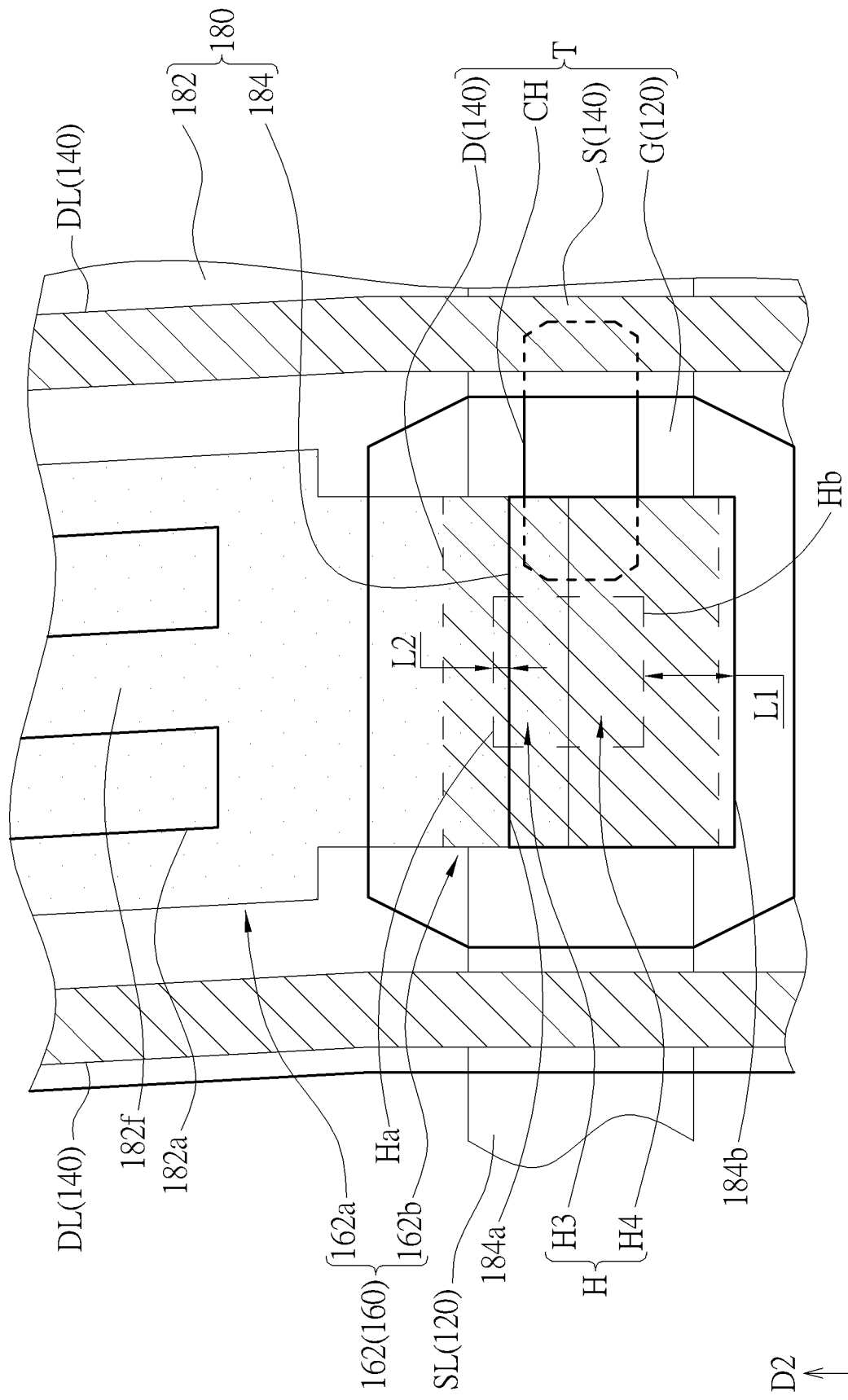
FIG. 5A is a top-view schematic diagram illustrating a portion of a pixel structure of a modification of the first embodiment of the present invention.
Figure 5B:
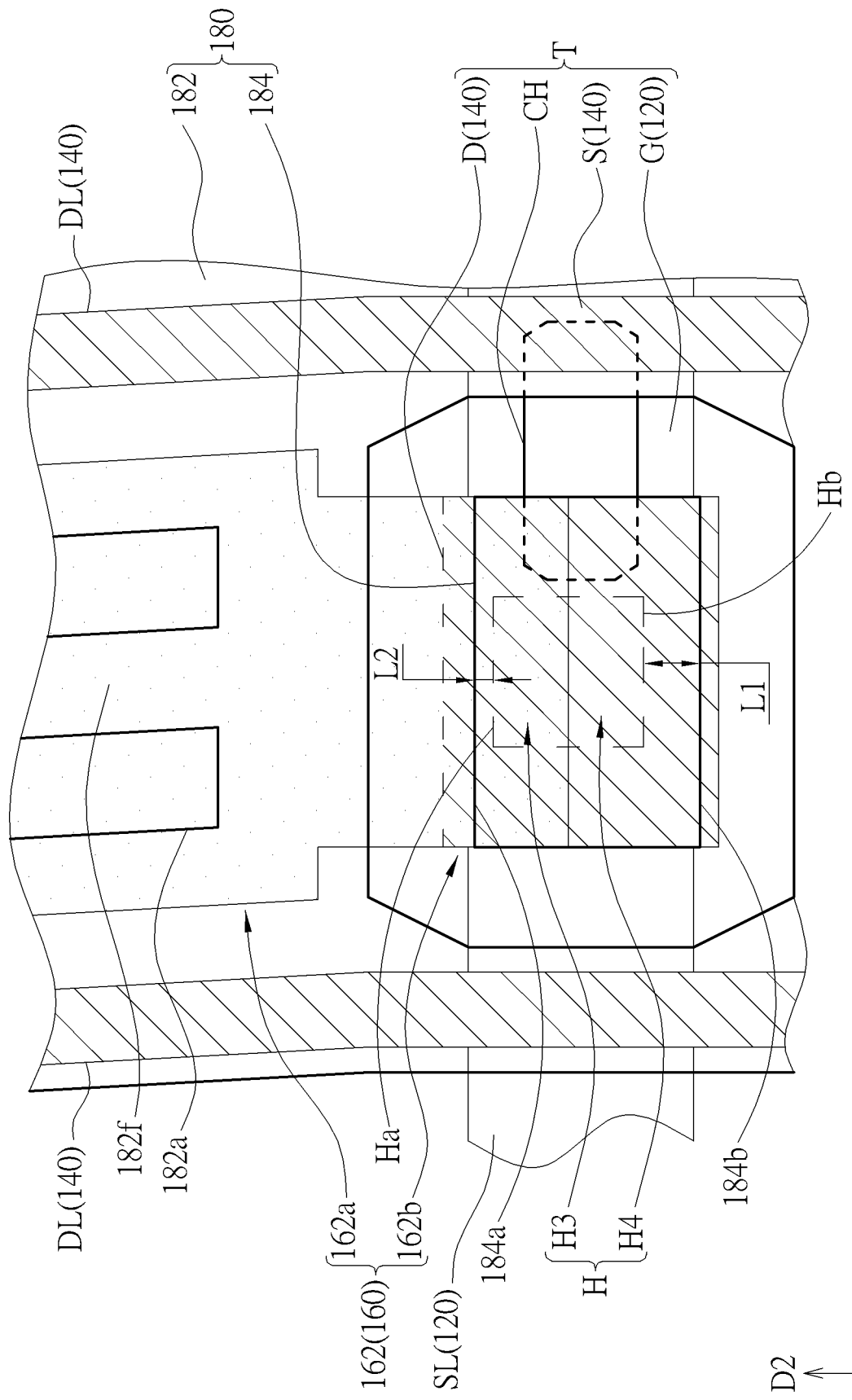
FIG. 5B is a top-view schematic diagram illustrating a portion of a pixel structure of another modification of the first embodiment of the present invention.

Because the connecting electrode 184 is electrically insulated from the common electrode 182, a specific distance between the connecting electrode 184 and the common electrode 182 needs to exist in consideration of the manufacturing process deviation. Furthermore, the size of the storage capacitor formed of the common electrode and the pixel electrode changes with the size of the connecting electrode, which influences the aperture ratio of the pixel. For example, if the area of the connecting electrode 184 is increased, the area of the common electrode 812 is reduced to maintain a specific distance between the connecting electrode 184 and the common electrode 182, such that the capacitance of the storage capacitor is reduced. Therefore, as shown in FIG. 3, in order to enhance the aperture ratio of the pixel of this embodiment, a distance between the first edge 184*a* of the connecting electrode 184 and the third edge Ha of the connecting hole H is reduced, such that the overlapping area of the common electrode 182 and the pixel electrode 162 is larger, which enhances the electrical characteristics of the storage capacitor and the aperture ratio of the pixel. In this embodiment, the first edge 184*a* of the connecting electrode 184 overlaps and is aligned to the third edge Ha of the connecting hole H, and the connecting electrode 184 completely covers the connecting hole H, but the invention is not limited thereto. Referring to FIG. 5A, FIG. 5A is a top-view schematic diagram illustrating a portion of a pixel structure of a modification of the first embodiment of the present invention. As shown in FIG. 5A, if the connecting electrode 184 does not completely cover the connecting hole H, that is if the connecting electrode 184 covers a portion of the connecting hole H, a portion of the pixel electrode 162 exposed in the connecting hole H overlaps the connecting electrode 184 in the vertical projection direction (a portion of the pixel electrode 162 exposed in the connecting hole H is in contact with the connecting electrode 184), and the other portion of the pixel electrode 162 exposed in the connecting hole H does not overlap the connecting electrode 184 (the other portion of the pixel electrode 162 exposed in the connecting hole H is not in contact with the connecting electrode 184). In other words, the first edge 184*a* is situated between the third edge Ha and the fourth edge Hb, and at least a portion of the first edge 184*a* is situated within the third portion H3 of the connecting hole H in the vertical projection direction. Referring to FIG. 5B, FIG. 5B is a top-view schematic diagram illustrating a portion of a pixel structure of another modification of the first embodiment of the present invention. As shown in FIG. 5B, the connecting electrode 184 completely covers the connecting hole H, and the third edge Ha is situated between the first edge 184*a* and the fourth edge Hb.

Regarding to FIG. 3, FIG. 5A and FIG. 5B, in an embodiment, if a layout of a photomask may be corresponding to the pixel structure shown in FIG. 3, the pixel structure shown in FIG. 3 is manufactured under the condition that the connecting electrode 184 does not have a offset with respect to the connecting hole H, the pixel structure of FIG. 5A is manufactured under the condition that the connecting electrode 184 has a negative offset with respect to the connecting hole H in the second direction D2, and the pixel structure of FIG. 5B is manufactured under the condition that the connecting electrode 184 has a positive offset with respect to the connecting hole H in the second direction D2, but the invention is not limited thereto. In another embodiment, if a layout of a photomask maybe corresponding to the pixel structure shown in FIG. 5A, the pixel structure shown in FIG. 5A is manufactured under the condition that the connecting electrode 184 does not have a offset with respect to the connecting hole H, and the pixel structures of FIG. 3 and FIG. 5B are manufactured under the condition that the connecting electrode 184 has a positive offset with respect to the connecting hole H in the second direction D2. In still another embodiment, if a layout of a photomask may be corresponding to the pixel structure shown in FIG. 5B, the pixel structure shown in FIG. 5B is manufactured under the condition that the connecting electrode 184 does not have a offset with respect to the connecting hole H, and the pixel structures of FIG. 3 and FIG. 5A are manufactured under the condition that the connecting electrode 184 has a negative offset with respect to the connecting hole H in the second direction D2. The layout of the photomask of the present invention configured to manufacture the pixel structure shown in FIG. 3, FIG. 5A or FIG. 5B is not limited to above embodiment. As shown in FIG. 3, since at least a portion of the first edge 184a of the connecting electrode 184 overlaps the third edge Ha of the connecting hole H (the third edge Ha is aligned to the first edge 184a in FIG. 3), such that the overlapping area of the common electrode 182 and the pixel electrode 162 is larger, which enhances the aperture ratio of the pixel and the capacitance of the storage capacitor. Moreover, as shown in FIG. 3, a first distance L1 exists between the second edge 184b of the connecting electrode 184 and the fourth edge Hb of the connecting hole H, the first distance L1 is greater than the offset of the connecting electrode 184 with respect to the connecting hole H in manufacturing process, and therefore, if the connecting electrode 184 has a positive offset with respect to the connecting hole H in the second direction D2 (such as the embodiment shown in FIG. 5B), the connecting electrode 184 still completely covers the drain D in the connecting hole H, so as to prevent metal (the drain D) from exposing and being corroded. For instance, the first distance L1 may be less than or equal to 3 μm, or be greater than or equal to 2 μm and less than or equal to 3 μm, but the invention is not limited thereto.

The pixel structure and the display device of the present invention are not limited to the above embodiments. Further embodiments or modifications of the present invention are described below. For ease of comparison, the same components will be labeled with the same symbol in the following description. The following description only details the differences between the embodiments, and same parts will not be redundantly described.

Figure 6:
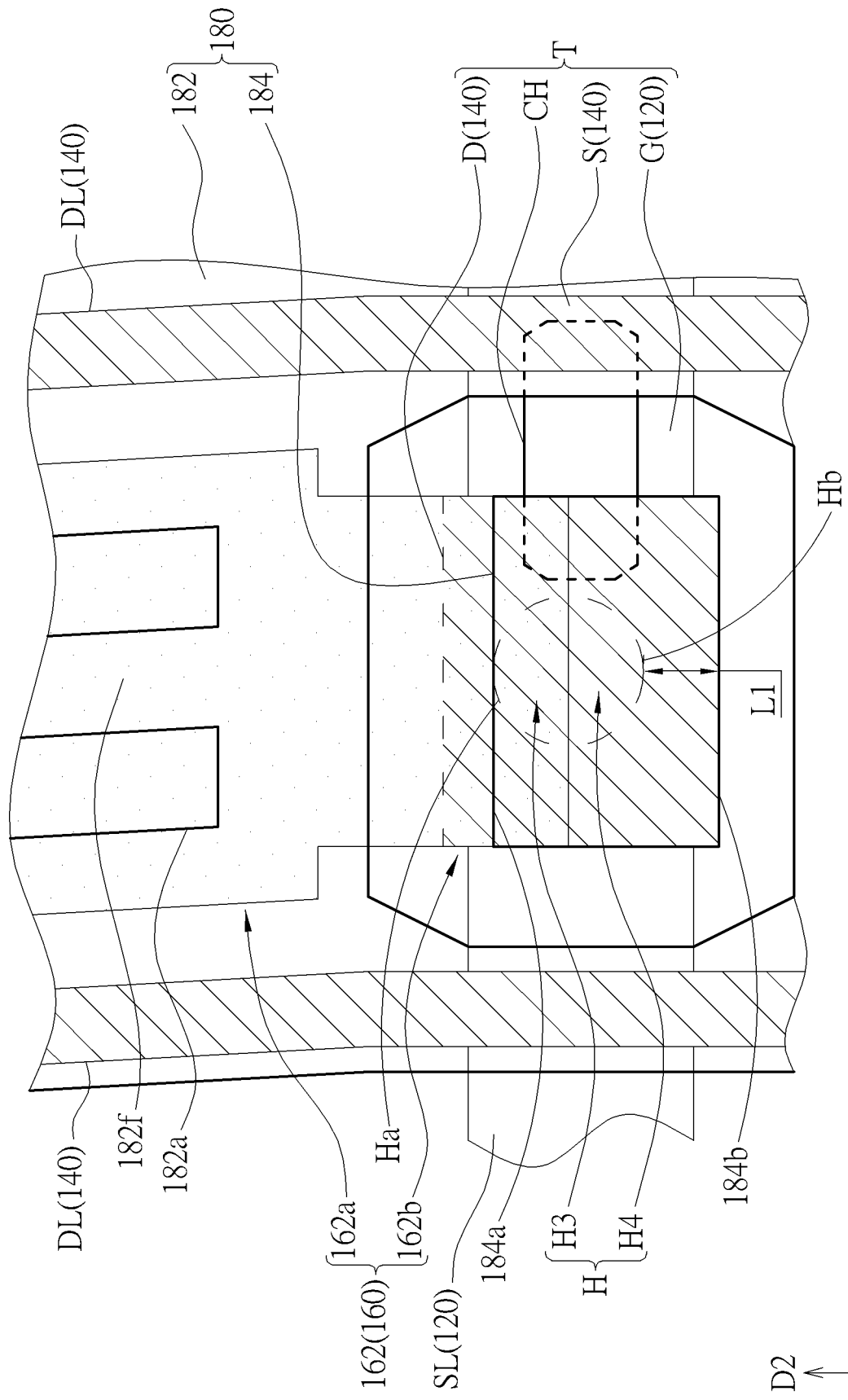
FIG. 6 is a top-view schematic diagram illustrating a portion of a pixel structure of still another modification of the first embodiment of the present invention.
Figure 7A:
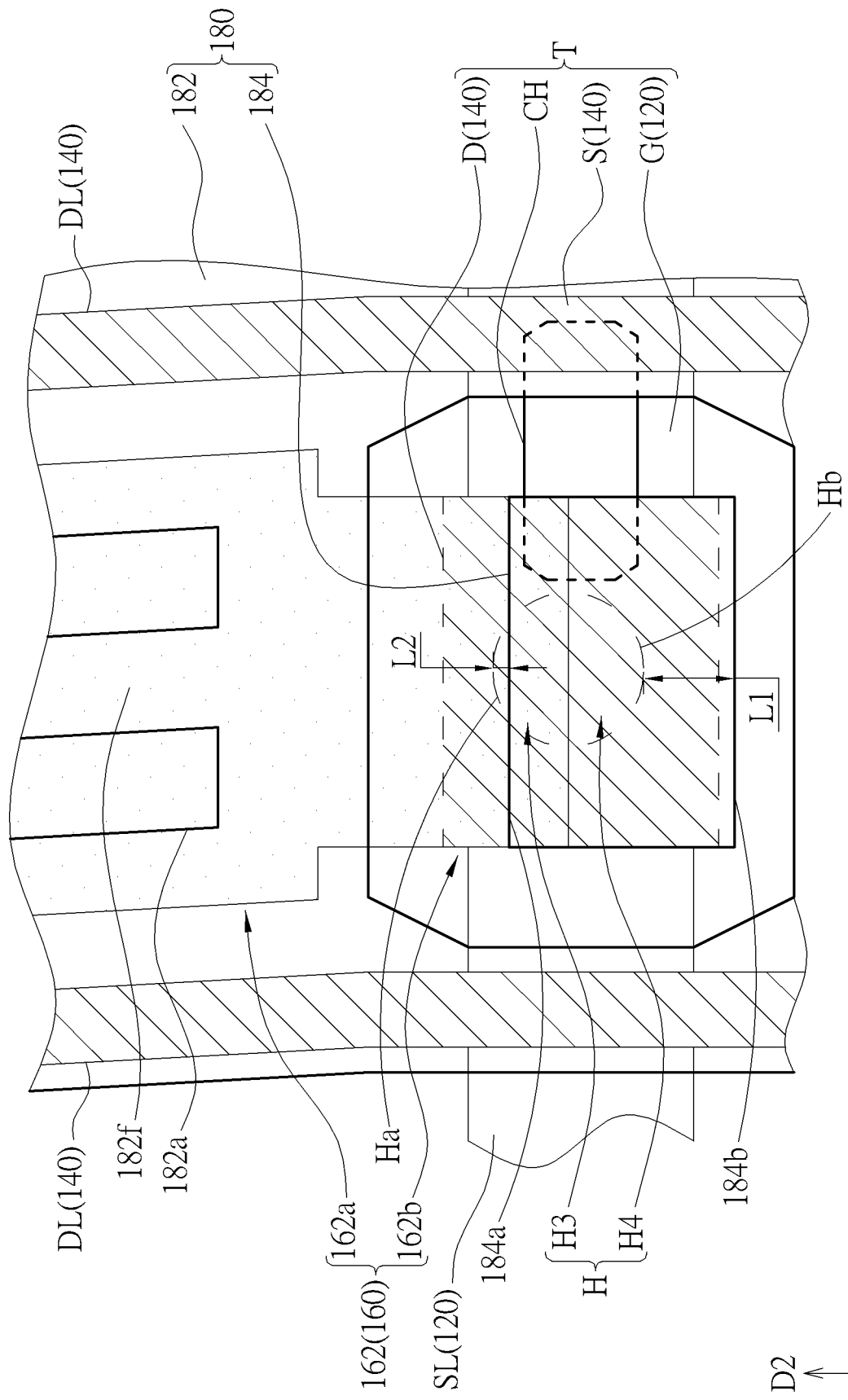
FIG. 7A and FIG. 7B are top-view schematic diagrams illustrating portions of pixel structures of modifications of the embodiment shown in FIG. 6.
Figure 7B:
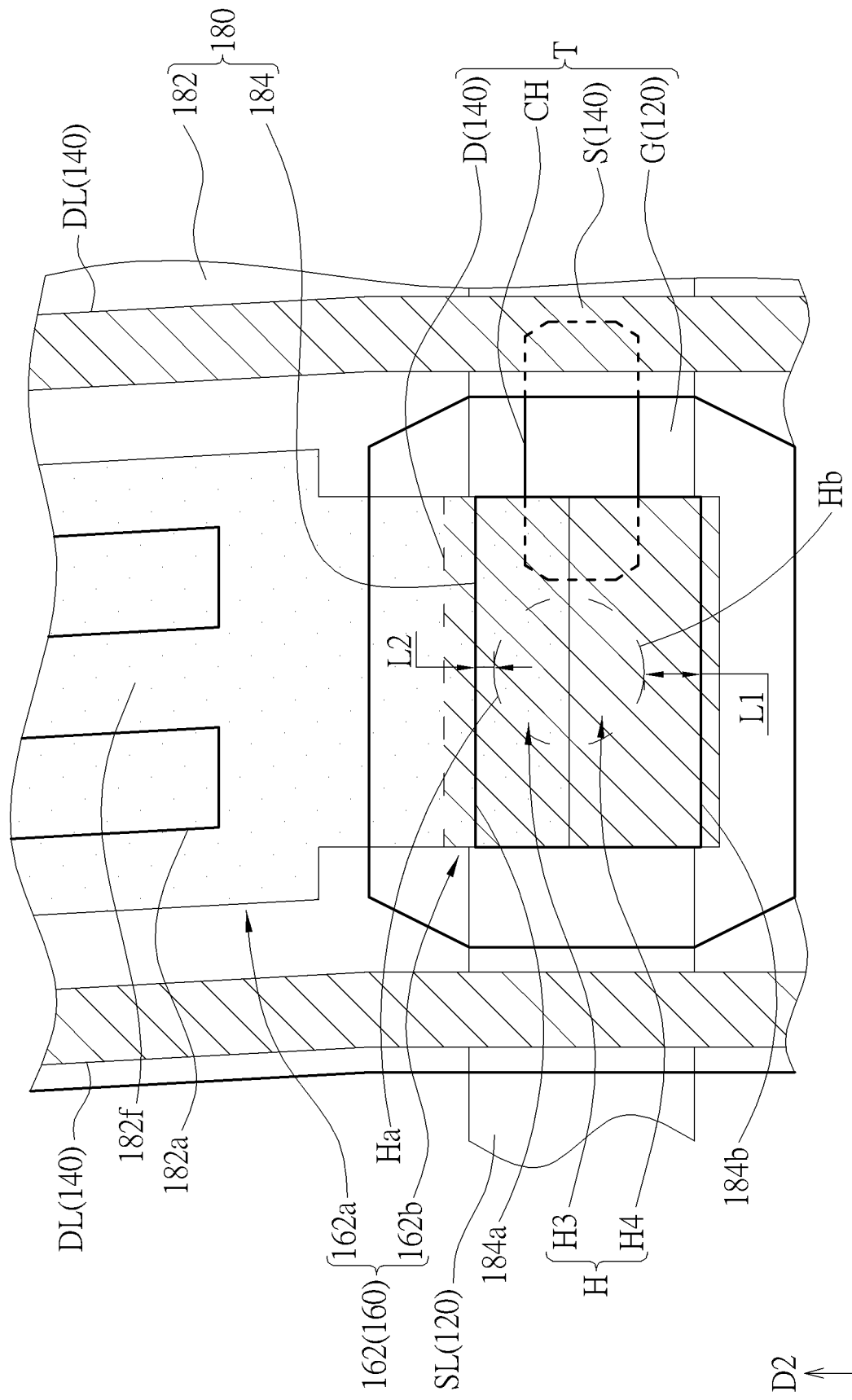

Referring to FIG. 6, FIG. 6 is a top-view schematic diagram illustrating a portion of a pixel structure of still another modification of the first embodiment of the present invention. As shown in FIG. 6, the difference between this modification and the first embodiment is that the shape of the connecting hole H is circular; that is, the type of the shape of the connecting hole H is different from the first embodiment. For example, if the shape of the connecting hole H on the photomask is square, after performing the exposure development and the etching process of the photo process, the shape of the connecting hole H may be produced to be circular usually, but the invention is not limited thereto. Thus, the third edge Ha and the fourth edge Hb of the connecting hole H are respectively two arcs of the connecting hole H in the second direction D2, and the two arcs are situated at two opposite sides of the connecting hole H. The first edge 184a of the connecting electrode 184 is tangential to the third edge Ha of the connecting hole H; in other words, a portion of the first edge 184a of the connecting electrode 184 overlaps a portion of the third edge Ha of the connecting hole H. Similar to the embodiment shown in FIG. 3, the first distance L1 exists between the second edge 184b of the connecting electrode 184 and the fourth edge Hb of the connecting hole H. Referring to FIG. 7A and FIG. 7B, FIG. 7A and FIG. 7B are top-view schematic diagrams illustrating portions of pixel structures of modifications of the embodiment shown in FIG. 6. As shown in FIG. 7A, the connecting electrode 184 does not completely covers the connecting hole H, a portion of the pixel electrode 162 exposed in the connecting hole H overlaps the connecting electrode 184 in the vertical projection direction, and the other portion of the pixel electrode 162 exposed in the connecting hole H does not overlap the connecting electrode 184. As shown in FIG. 7B, the connecting electrode 184 completely covers the connecting hole H, and a distance between an edge of the connecting hole H and the edge of the connecting electrode 184 is greater than 0.

According to the embodiments shown in FIG. 3, FIG. 5B, FIG. 6 and FIG. 7B, the connecting electrode 184 completely covers the connecting hole H, and a portion of the connecting electrode 184 overlaps the connecting hole H in the vertical projection direction. In the embodiments shown in FIG. 3 and FIG. 6, a portion of the edges of the connecting hole H overlaps a portion of the edges of the connecting electrode 184. In the embodiments shown in FIG. 5B and FIG. 7B, the edges of the connecting electrode 184 are situated outside the edges of the connecting hole H in the vertical projection direction, and the edges of the connecting electrode 184 do not overlap the connecting hole H. Moreover, in the embodiments shown in FIG. 5A and FIG. 7A, the connecting electrode 184 covers a portion of the connecting hole H. In other words, a portion of the connecting hole H overlaps a portion of the connecting electrode 184 in the vertical projection direction, and a portion of the edges of the connecting electrode 184 is situated in the connecting hole H in the vertical projection direction. As shown in FIG. 3 and FIG. 6, a portion of the first edge 184a overlaps a portion of the third edge Ha. As shown in FIG. 5A, FIG. 5B, FIG. 7A and FIG. 7B, a second distance L2 exists between the first edge 184a and the third edge Ha. Furthermore, in FIG. 3, FIG. 5A, FIG. 5B, FIG. 6, FIG. 7A and FIG. 7B, the first distance L1 exists between the second edge 184b and the fourth edge Hb, wherein the second distance L2 is a distance between a point of the third edge Ha closest to the first portion 162a of the pixel electrode 162 and the first edge 184a in a direction perpendicular to the first edge 184a, and the first distance L1 is a distance between a point of the fourth edge Hb furthest to the first portion 162a of the pixel electrode 162 and the second edge 184b in a direction perpendicular to the second edge 184b. In the embodiment of which the connecting electrode 184 completely covers the connecting hole H and the edges of the connecting electrode 184 is situated outside the edges of the connecting hole H in the vertical projection direction (such as FIG. 5B and FIG. 7B), or in the embodiment of which the connecting electrode 184 covers a portion of the connecting hole H and a portion of the edges of the connecting electrode 184 is situated in the connecting hole H in the vertical projection direction (such as FIG. 5A and FIG. 7A), the second distance L2 is less than or equal to 2.4 μm, or is less than or equal to 1.7 μm, and the first distance L1 is greater than or equal to 0.6 μm and less than or equal to 5.4 μm, but the invention is not limited thereto.

Note that the shape of the connecting hole H shown in FIG. 1 to FIG. 7 is rectangular or circular for example, but the present invention does not limit the shape of the connecting hole H. For instance, the shape of the connecting hole H may be polygonal, and the disposition and position of the connecting hole H is similar to one of the embodiments of FIG. 1 to FIG. 7B, and will not be redundantly described.

Figure 8A:
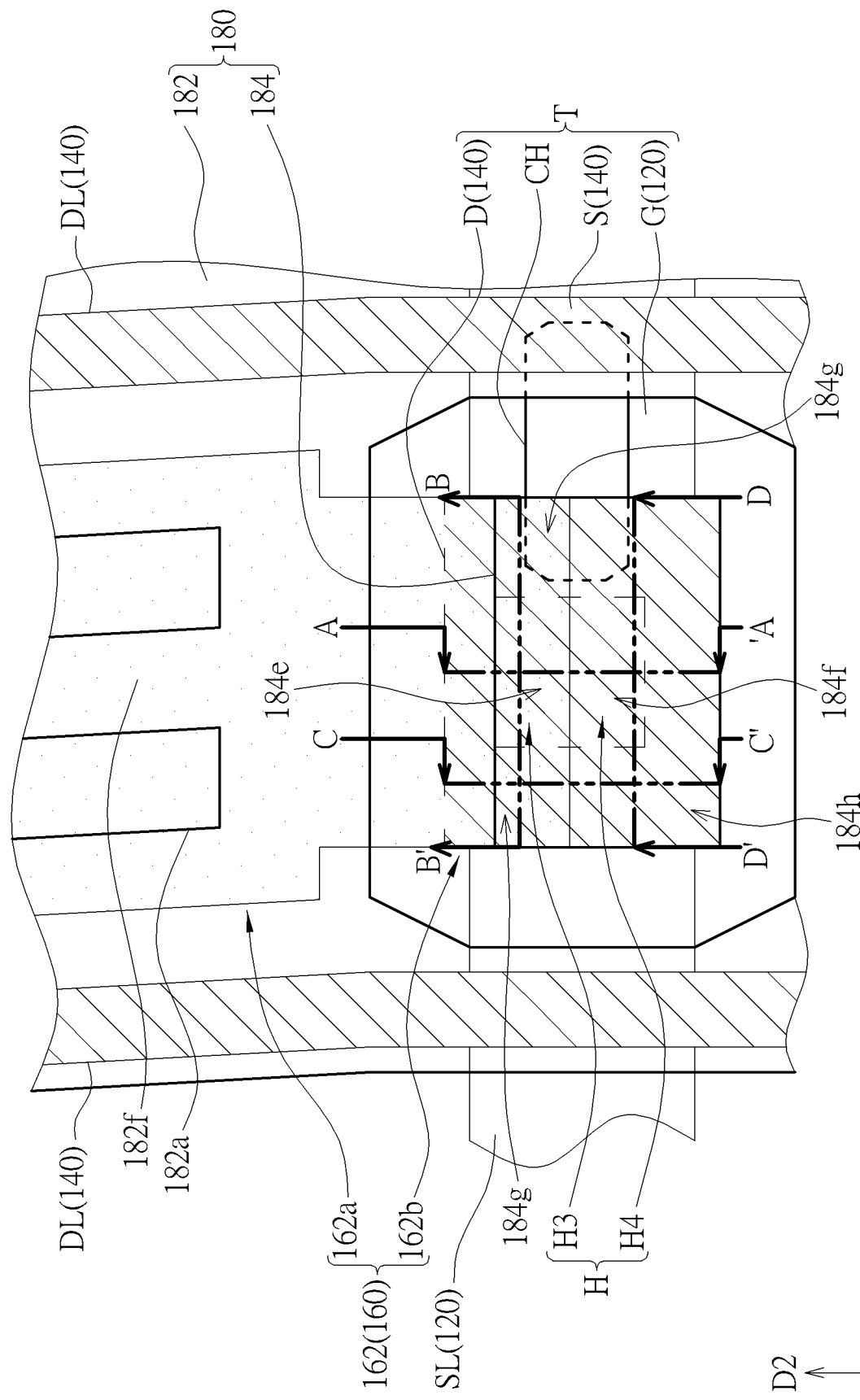
FIG. 8A is a top-view schematic diagram illustrating the portion of the pixel structure of the first embodiment of the present invention.
Figure 8B:
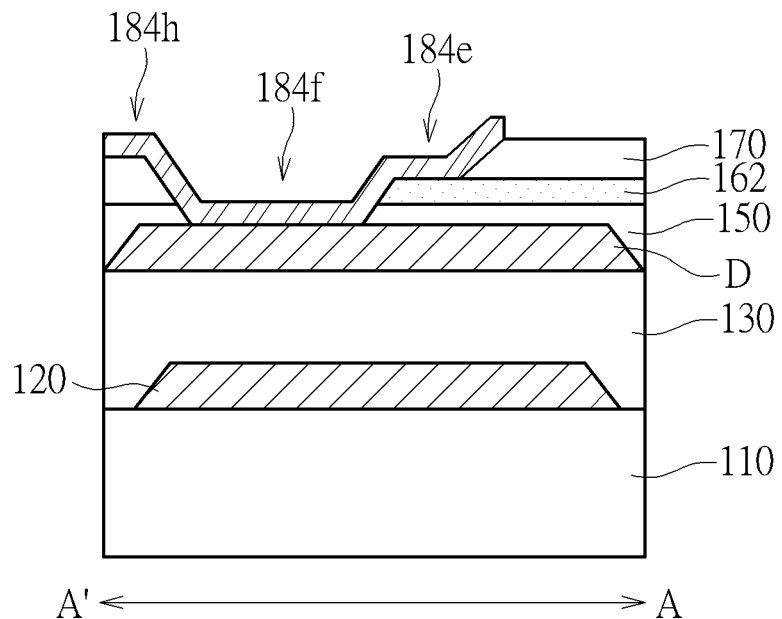
FIG. 8B to FIG. 8E are cross-sectional-view schematic diagrams respectively taken along cross-sectional lines AA', BB', CC' and DD' in FIG. 8A.
Figure 8C:
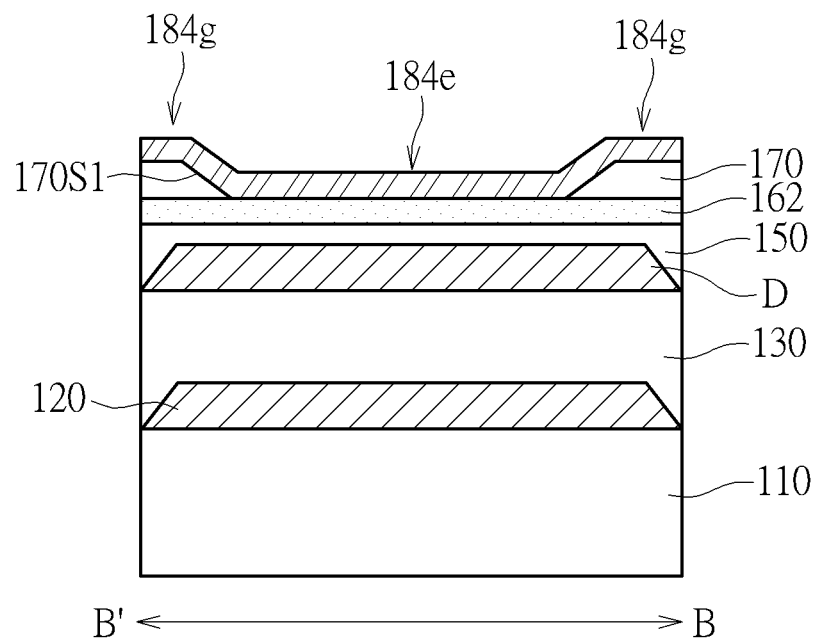
Figure 8D:
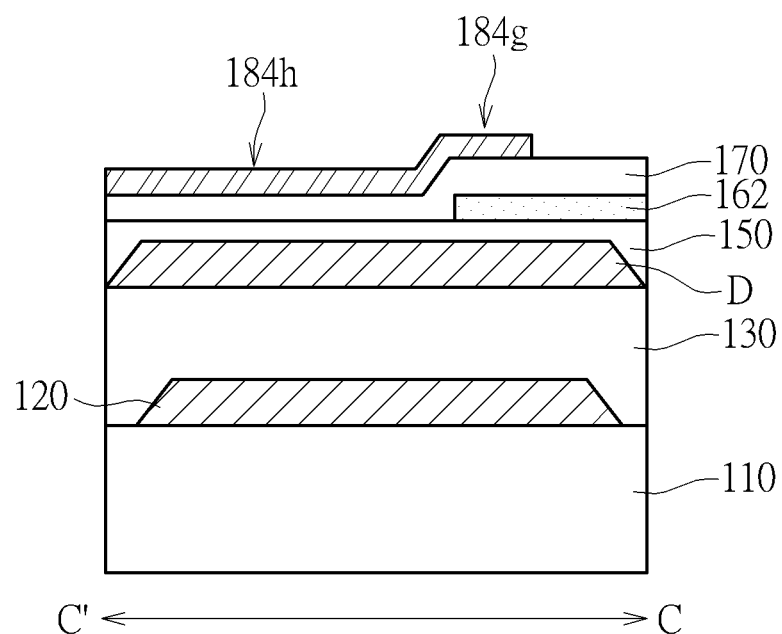
Figure 8E:
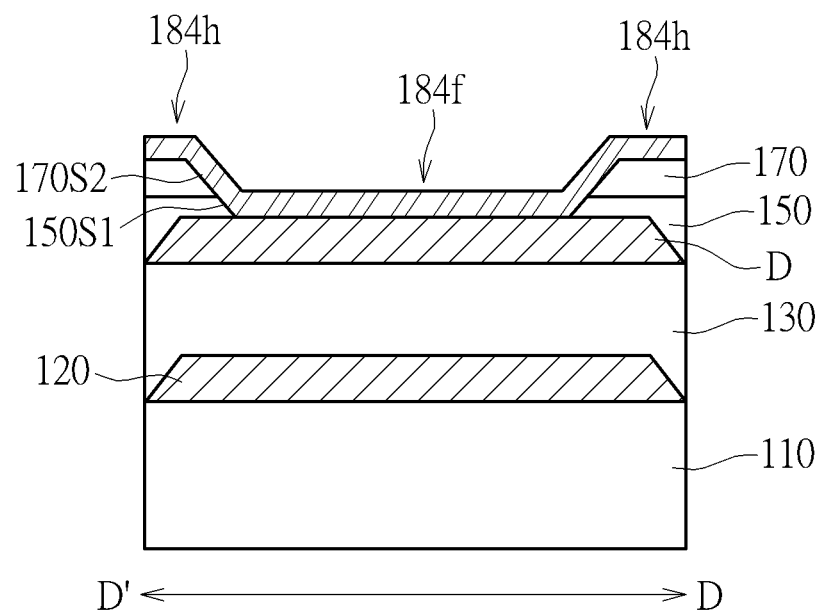
Figure 8F:
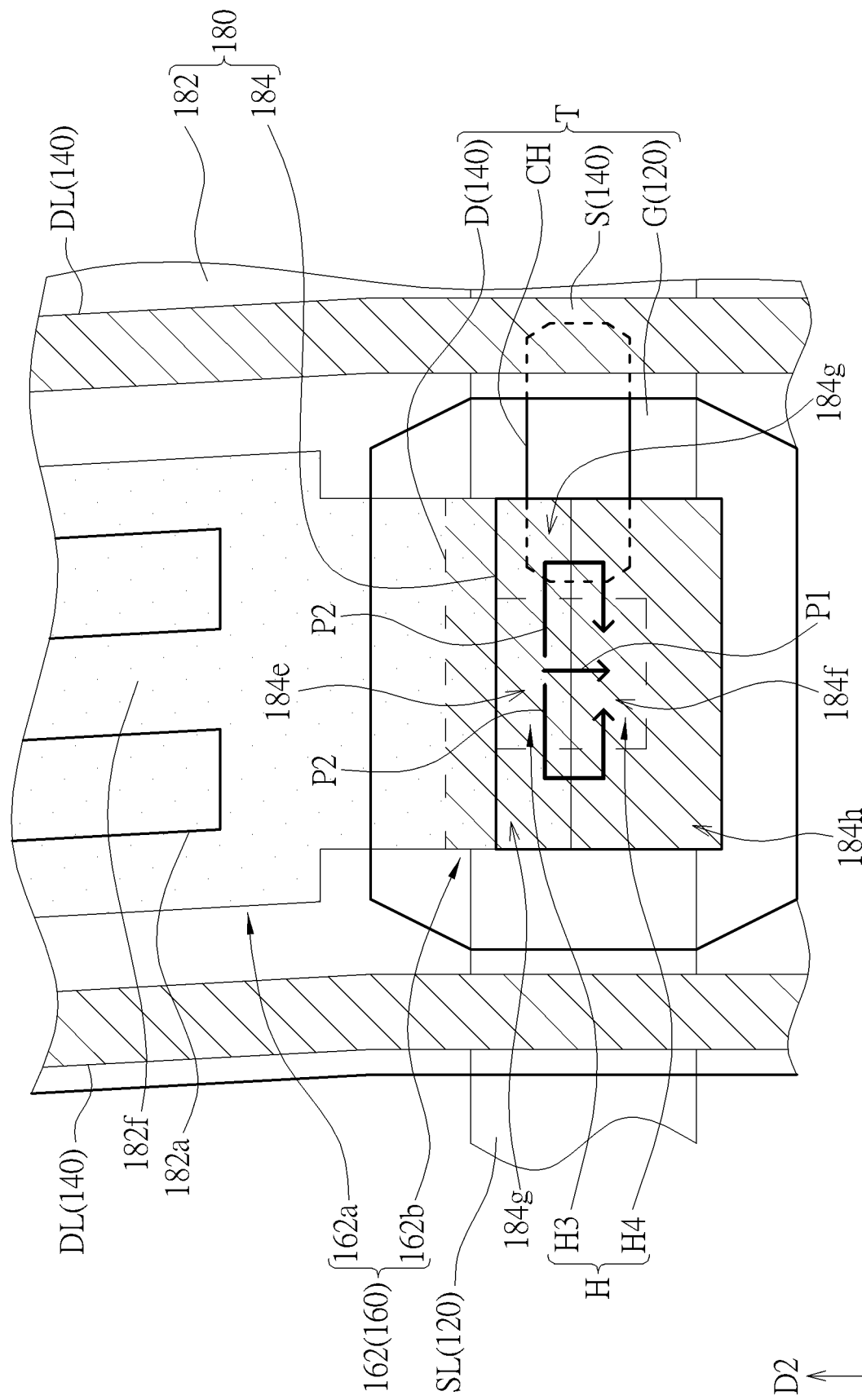
FIG. 8F is a schematic diagram illustrating electrical connection paths between the pixel electrode and the drain of the first embodiment of the present invention.
Figure 8G:
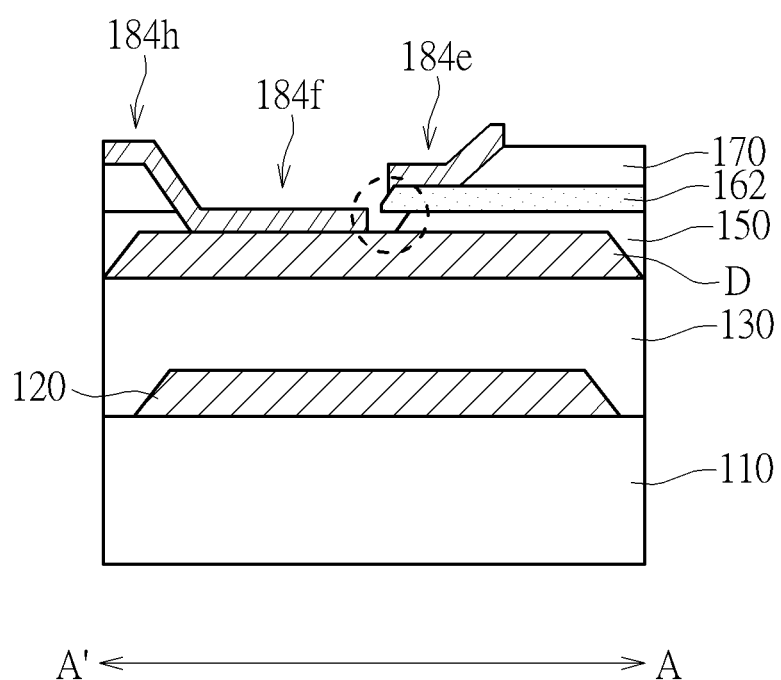
FIG. 8G is another cross-sectional-view schematic diagram taken along the cross-sectional line AA' in FIG. 8A.

Referring to FIG. 8A to FIG. 8F, FIG. 8A is a top-view schematic diagram illustrating the portion of the pixel structure of the first embodiment of the present invention, FIG. 8B to FIG. 8E are cross-sectional-view schematic diagrams respectively taken along cross-sectional lines AA', BB', CC' and DD' in FIG. 8A, and FIG. 8F is a schematic diagram illustrating electrical connection paths between the pixel electrode and the drain of the first embodiment of the present invention. FIG. 8A is similar to FIG. 3, the differences are that FIG. 8A omits some symbols of some components and FIG. 8A also marks a plurality portions of the connecting electrode 184. As shown in FIG. 8A, the connecting electrode 184 includes a fifth portion 184*e*, a sixth portion 184*f*, a seventh portion 184*g* and an eighth portion 184*h*. In the vertical projection direction, the fifth portion 184*e* overlaps the third portion H3 of the connecting hole H, the sixth portion 184*f* overlaps the fourth portion H4 of the connecting hole H, the seventh portion 184*g* and the eighth portion 184*h* are disposed in a region surrounding the connecting hole H, the seventh portion 184*g* overlaps a portion of the pixel electrode 162 and a portion of the drain D, and the eighth portion 184*h* overlaps a portion of the drain D. The fifth portion 184*e* and the sixth portion 184*f* of the connecting electrode are respectively in contact with the portion of the pixel electrode 162 and the portion of the drain D exposed by the connecting hole H, the second insulating layer 170 is between the seventh portion 184*g* of the connecting electrode 184 and the pixel electrode 162, and the first insulating layer 150 and the second insulating layer 170 are between the eighth portion 184*h* of the connecting electrode and the drain D. As shown in FIG. 8A and FIG. 8B, the fifth portion 184*e* is coupled to (or in contact with) the sixth portion 184*f* in the connecting hole H, and the fifth portion 184*e* and the sixth portion 184*f* are respectively in contact with the pixel electrode 162 and the drain D, so as to be electrically connected to the pixel electrode 162 and the drain D. Accordingly, the pixel electrode 162 is electrically connected to the drain D through the fifth portion 184*e* and the sixth portion 184*f* of the connecting electrode 184. In other words, the pixel electrode 162 is electrically connected to the drain D through a portion of the connecting electrode 184 overlapping the connecting hole H (e.g. the fifth portion 184*e* and the sixth portion 184*f* of the connecting electrode 184) in the vertical projection direction. An electrical connection path between the pixel electrode 162 and the drain D described above is corresponding to a first electrical connection path P1 shown in FIG. 8F. As shown in FIG. 8B to FIG. 8E, the fifth portion 184*e* is in contact with the pixel electrode 162 in the connecting hole H (shown in FIG. 8B), the fifth portion 184*e* extends from the bottom of the third portion H3 of the connecting hole H to be above the second insulating layer 170 along a sidewall 170S1 of the second insulating layer 170, and is coupled to (or in contact with) the seventh portion 184*g* (shown in FIG. 8C) disposed on the second insulating layer 170 and the pixel electrode 162, the seventh portion 184*g* is coupled to (or in contact with) the eighth portion 184*h* (shown in FIG. 8D) disposed on the second insulating layer 170 and the first insulating layer 150, the eighth portion 184*h* extends to the bottom of the fourth portion H4 of the connecting hole H along a sidewall 170S2 of the second insulating layer 170 and a sidewall 150S1 of the first insulating layer 150, and is coupled to (or in contact with) the sixth portion 184*f* (shown in FIG. 8E) disposed on the bottom of the fourth portion H4 of the connecting hole H and is in contact with the drain D in the connecting hole H (shown in FIG. 8E). Thus, the pixel electrode 162 may be electrically connected to the drain D through the fifth portion 184*e*, the seventh portion 184*g*, the eighth portion 184*h* and the sixth portion 184*f* in sequence. In other words, the pixel electrode 162 is electrically connected to the drain D through a portion of the connecting electrode 184 overlapping the connecting hole H (e.g. the fifth portion 184*e* and the sixth portion 184*f*) and another portion of the connecting electrode 184 not overlapping the connecting hole H (e.g. the seventh portion 184*g* and the eighth portion 184*h*) in the vertical projection direction. An electrical connection path between the pixel electrode 162 and the drain D described above is corresponding to a second electrical connection path P2 shown in FIG. 8F. In this embodiment, the connecting hole H is formed by one photo-etching-process (PEP). Therefore, after patterning the photoresist, the etching process is performed for removing a portion of the first insulating layer 150 and a portion of the second insulating layer 170 in sequence, so as to form the connecting hole H. In the etching process, the second insulating layer 170 corresponding to the third portion H3 and the fourth portion H4 would be removed firstly, and then, because the first insulating layer 150 corresponding to the third portion H3 is under the pixel electrode 162, the first insulating layer 150 corresponding to the third portion H3 (a portion of the first insulating layer 150 overlapping the third portion H3 in the vertical projection direction) is not removed and the first insulating layer 150 corresponding to the fourth portion H4 (a portion of the first insulating layer 150 overlapping the fourth portion H4 in the vertical projection direction) is removed for exposing the drain D when etching the first insulating layer 150. Thereafter, the second transparent conductive layer 180 including the common electrode 182 and the connecting electrode 184 is formed, and the connecting electrode 184 in the connecting hole H may extend from the pixel electrode 162 through a sidewall of the first insulating layer 150 to the drain D (shown in FIG. 8B), but the present invention is not limited thereto. Referring to FIG. 8G, in another embodiment, because the etching process not only etches downward but also etches slightly toward the lateral direction, when the first insulating layer 150 corresponding to the fourth portion H4 is etched, the first insulating layer 150 corresponding to the third portion H3 may be slightly etched in the lateral direction simultaneously while the pixel electrode 162 is not etched in the vertical and lateral direction, such that the sidewall of the pixel electrode 162 is discontinuous with the sidewall of the first insulating layer 150 under the pixel electrode 162, and the undercut phenomenon (a portion surrounding the dot line shown in FIG. 8G) occurs in the first insulating layer 150 under the pixel electrode 162. Thus, after forming the connecting electrode 184, the connecting electrode 184 in the connecting hole H may have a disconnection structure, such that the pixel electrode 162 is not electrically connected to the drain D through the first electrical connection path P1. On the other hand, the pixel electrode 162 can be electrically connected to the drain D through the connecting electrode 184 situated at the region surrounding the connecting hole H; that is, the pixel electrode 162 may be electrically connected to the drain D through the fifth portion 184*e*, the seventh portion 184*g*, the eighth portion 184*h* and the sixth portion 184*f* of the connecting electrode 184 in sequence (the pixel electrode 162 may be electrically connected to the drain D through the second electrical connection path P2). By the specific layout design of the drain D, the pixel electrode 162, the connecting hole H and the connecting electrode 184 in the present invention, even if the undercut phenomenon occurs in the first insulating layer 150 under the pixel electrode 162 when forming the connecting hole H, and the fifth portion 184*e* may not be in contact with the sixth portion 184*f* in the connecting hole H directly (the pixel electrode 162 may not be electrically connected to the drain D through the first electrical connection path P1), the pixel electrode 162 may be electrically connected to the drain D through the second electrical connection path P2. Therefore, the product yield may be increased in the present invention. In FIG. 8A, note that the seventh portion 184*g* of this embodiment is disposed at two sides (left side and right side) of the fifth portion 184e, and the eighth portion 184h is disposed at three sides (left side, right side and lower side) of the sixth portion 184f, but the invention is not limited thereto. In another embodiment, the seventh portion 184g may be only disposed at one side (left side or right side) of the fifth portion 184e, and the eighth portion 184h may be only disposed at one side (left side or right side) or two sides (left side and lower side, or right side and lower side) of the sixth portion 184f, such that the pixel electrode 162 may be electrically connected to the drain D through the second electrical connection path P2 even if the undercut phenomenon occurs in the first insulating layer 150 under the pixel electrode 162. For instance, if the seventh portion 184g is disposed at the left side of the fifth portion 184e, and the eighth portion 184h is disposed at the left side or disposed at the left side and lower side of the sixth portion 184f, the pixel electrode 162 may be electrically connected to the drain D through the second electrical connection path P2. The above description is based on the embodiment of FIG. 3, and the embodiments of FIG. 5A to FIG. 7B are similar to the embodiment of FIG. 3 and will not be redundantly described.

Figure 9:
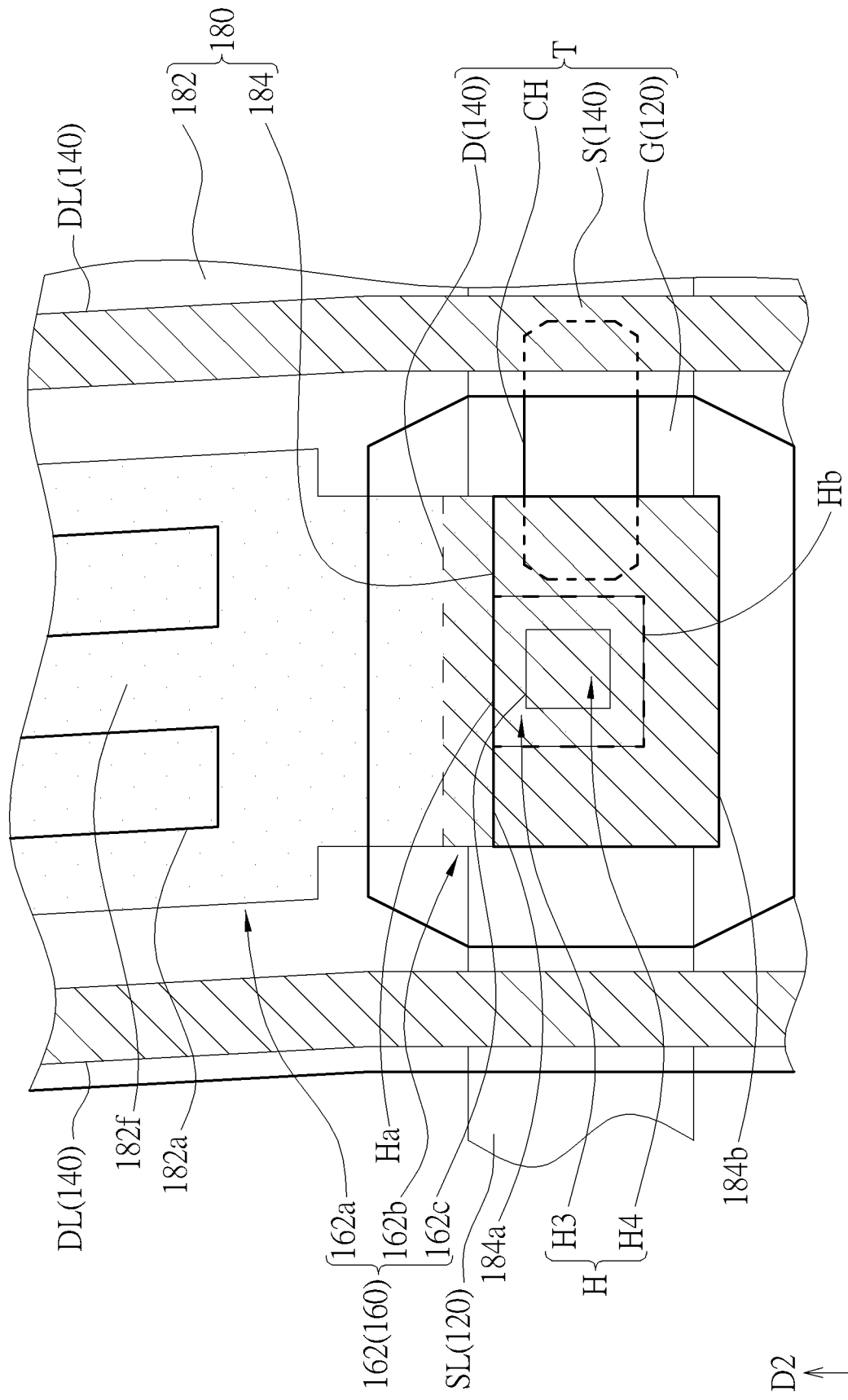
FIG. 9 is a top-view schematic diagram illustrating a portion of a pixel structure of a second embodiment of the present invention.

Referring to FIG. 9, FIG. 9 is a top-view schematic diagram illustrating a portion of a pixel structure of a second embodiment of the present invention. The difference between this embodiment and the first embodiment is that the third portion H3 of the connecting hole H of the pixel structure 100 of this embodiment surrounds the fourth portion H4. In other words, the pixel electrode 162 has an opening 162c, and the opening 162c exposes the drain D. In the manufacturing process of this embodiment, the opening 162c is formed when forming the pixel electrode 162. Then, after forming the second insulating layer 170 and before forming the second transparent conductive layer 180, the etching process is performed for etching the first insulating layer 150 and the second insulating layer 170, wherein etchant may passes through the opening 162c of the pixel electrode 162 to etch the first insulating layer 150 directly after etching the second insulating layer 170, so as to make the connecting hole H expose a portion of the pixel electrode 162 and a portion of the drain D. Thereafter, the second transparent conductive layer 180 is formed, the connecting electrode 184 extends into the connecting hole H, and the connecting electrode 184 is in contact with and electrically connected to the drain D and the pixel electrode 162, but the manufacturing process is not limited thereto. In FIG. 9, the shape of the connecting hole H of this embodiment is rectangular, but the invention is not limited thereto. In another embodiment, the connecting hole H may have other shape, such as the connecting hole H is circular or polygonal.

Figure 10A:
FIG. 10A to FIG. 10E are schematic diagrams illustrating a manufacturing process of the pixel structure of the first embodiment of the present invention.
Figure 10B:
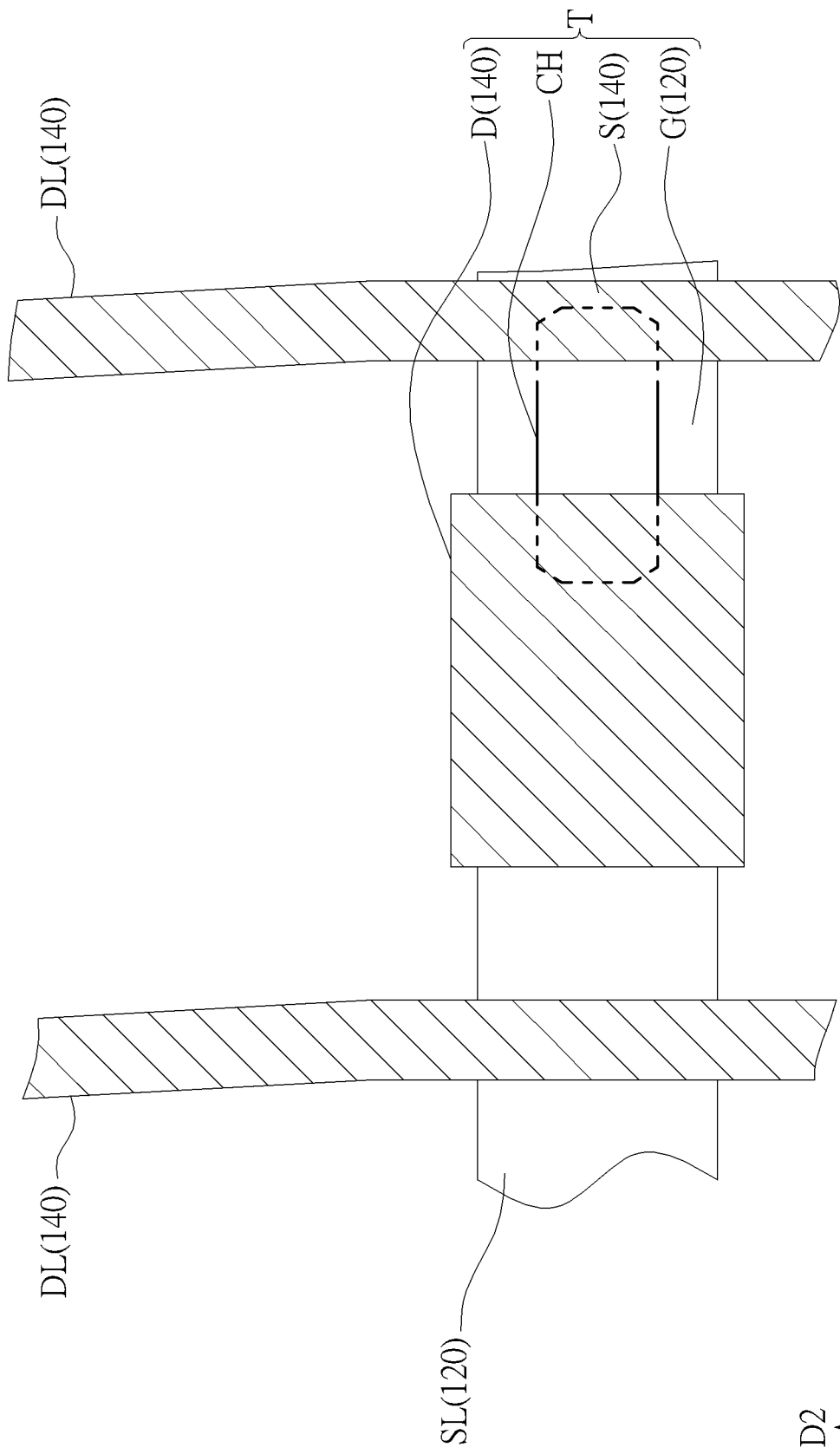
Figure 10C:
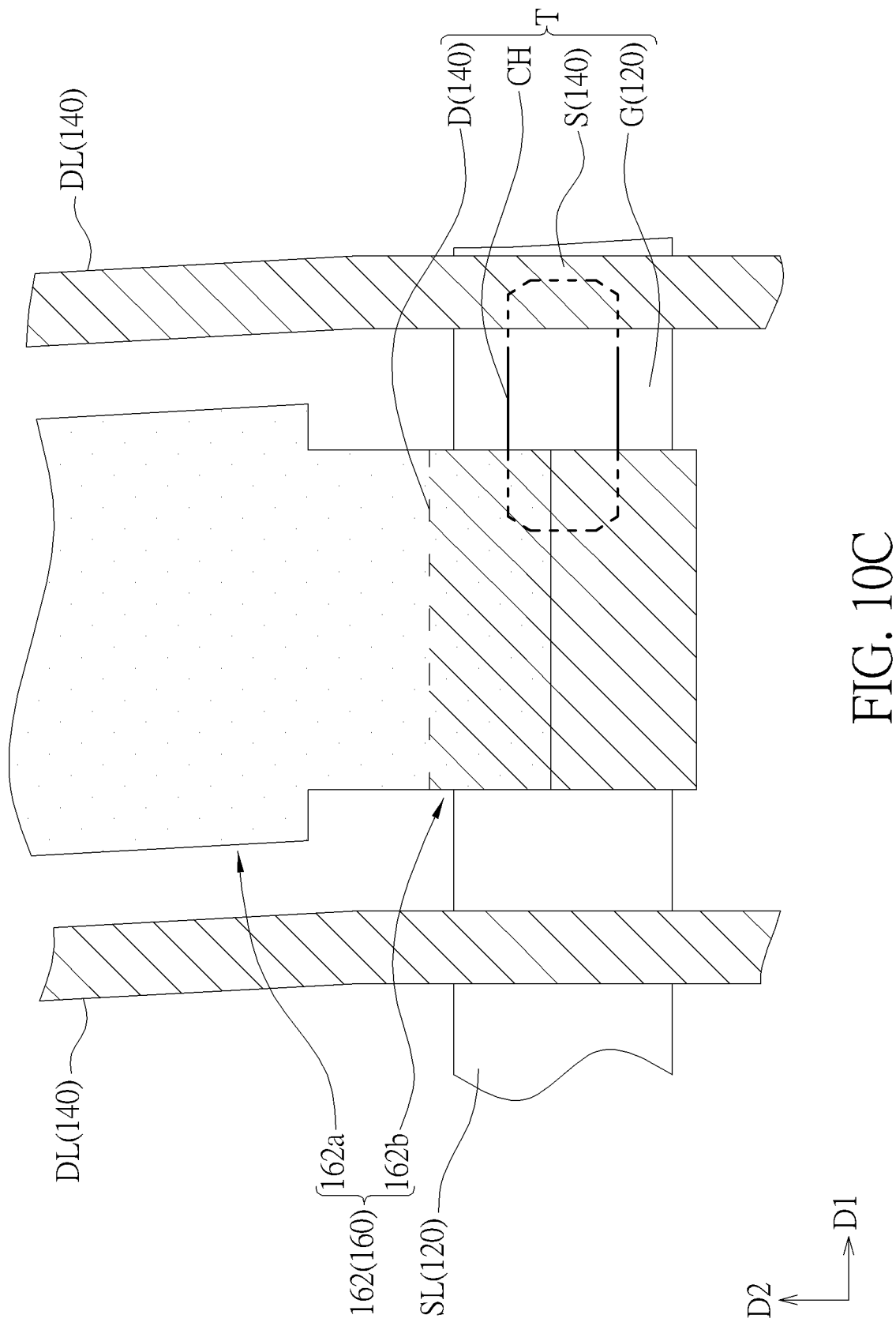
Figure 10D:
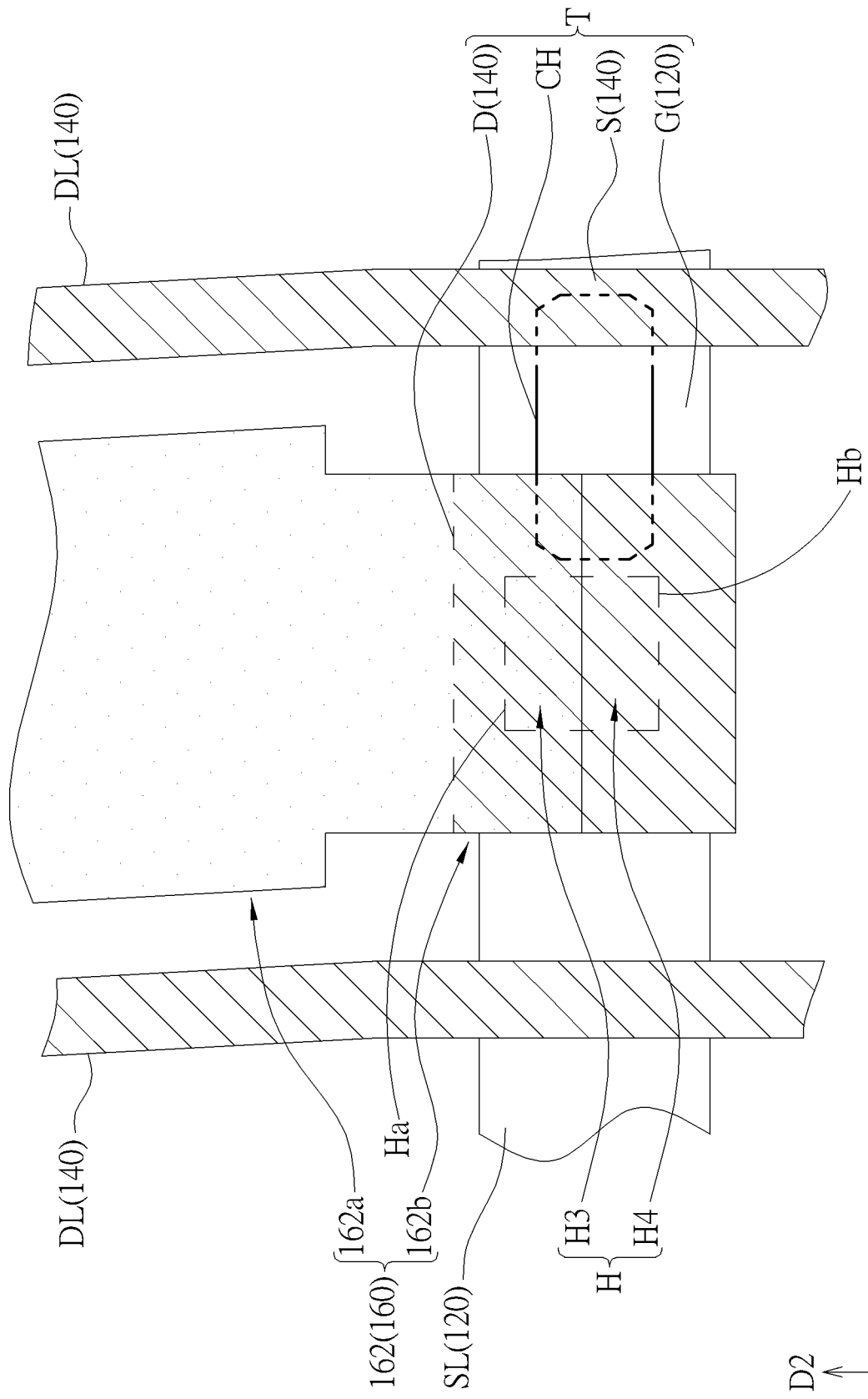
Figure 10E:
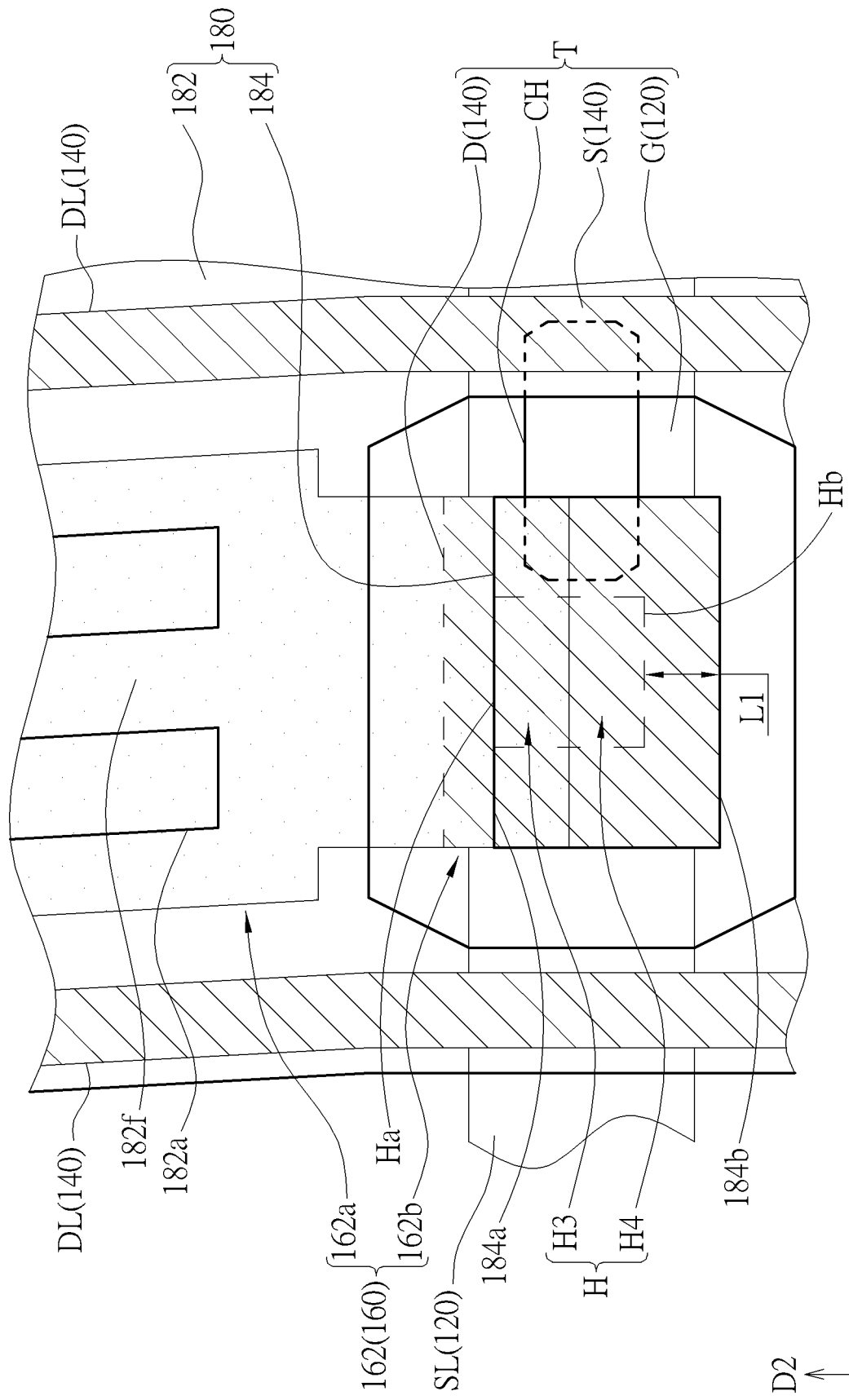

Referring to FIG. 10 to FIG. 10E, FIG. 10A to FIG. 10E are schematic diagrams illustrating a manufacturing method of the pixel structure of the first embodiment of the present invention. As shown in FIG. 10A, the first conductive layer 120 is formed on the substrate, and the first conductive layer 120 includes the scan line SL and the gate G. As shown in FIG. 10B, the third insulating layer 130 (not shown in FIG. 10B), the semiconductor layer CH and the second conductive layer 140 are formed in sequence, the third insulating layer 130 includes the gate insulating layer GI, and the second conductive layer 140 includes the data line DL, the source S and the drain D. As shown in FIG. 10C, the first insulating layer 150 (not shown in FIG. 10C) and the first transparent conductive layer 160 are formed, the first transparent conductive layer 160 includes the pixel electrode 162, the pixel electrode 162 includes the first portion 162a and the second portion 162b, and the second portion 162b overlaps a portion of the drain D in the vertical projection direction. As shown in FIG. 10D, after forming the second insulating layer 170 (not shown in FIG. 10D), a portion of the first insulating layer 150 and a portion of the second insulating layer 170 are removed for forming the connecting hole H, and the connecting hole H exposes the portion of the pixel electrode 162 and the portion of the drain D. As shown in FIG. 10E, the second transparent conductive layer 180 is formed, in which the second transparent conductive layer 180 includes the common electrode 182 and the connecting electrode 184, and the common electrode 182 has the slits 182a. The connecting electrode 184 extends into the connecting hole H and is in contact with the pixel electrode 162 and the drain D, such that the pixel electrode 162 is electrically connected to the drain D through the connecting electrode 184. In this embodiment, the connecting hole H is formed by one photo-etching-process (PEP), so as to reduce the process steps, but the invention is not limited thereto. In another embodiment, the connecting hole H exposing the portion of the pixel electrode 162 and the portion of the drain D may be formed by two or more different processes. For instance, if the first insulating layer 150 includes a non-photosensitive insulating material layer and a photosensitive insulating material (such as photosensitive resin) layer (that is, the first insulating layer 150 is a double-layer structure) disposed on the non-photosensitive insulating material layer, after forming the first insulating layer 150, a portion of the photosensitive insulating material layer is removed by one photo-etching-process and a portion of the non-photosensitive insulating material layer is exposed, and then after forming the second insulating layer 170, a portion of the second insulating layer 170 and the portion of the non-photosensitive insulating material layer is removed by another photo-etching-process to form the connecting hole H. The step of removing the portion of the photosensitive insulating material layer may be performed before the step of forming the first transparent conductive layer 160, or the step of removing the portion of the photosensitive insulating material layer maybe performed before the step of forming the second insulating layer 170 and after the step of forming the first transparent conductive layer 160, but the invention is not limited thereto. Note that the pixel structure shown in FIG. 10A to FIG. 10E is corresponding to the embodiment shown in FIG. 1 to FIG. 4, and the manufacturing processes of the pixel structures shown in FIG. 5A to FIG. 7B are similar to FIG. 10A to FIG. 10E, and repeated parts will not be redundantly described.

In summary, in the pixel structure of the display device of the present invention, since the first insulating layer is disposed between the pixel electrode and the second conductive layer including the data line, the drain and the source, and the second insulating layer is disposed between the pixel electrode and the common electrode, the capacitance of the storage capacitor formed of the pixel electrode and the common electrode may be enhanced by reducing the thickness of the second insulating layer, and the possibility of the metal puncture and the load between the data line and the common electrode may be decreased by increasing the thickness of the first insulating layer. Accordingly, the electrical characteristics of the storage capacitor can be enhanced, or the adverse effect is reduced while increasing the resolution. On the other hand, the connecting hole of the present invention is in the first insulating layer and the second insulating layer and exposes a portion of the pixel electrode and a portion of the drain, and therefore, the connecting hole for electrically connecting the pixel electrode to the drain may be formed by one etching process only. Furthermore, when the common electrode is formed, the connecting electrode extending into the connecting hole and being electrically connected to the pixel electrode and the drain is formed simultaneously, so as to reduce the cost of the manufacture. Moreover, the size of the connecting electrode and the overlapping between the pixel electrode and the drain may be shrunk to enhance the aperture ratio of the pixel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, comprising:
a thin film transistor disposed on a substrate, and the thin film transistor comprising a gate, a source and a drain;
a first insulating layer disposed on the thin film transistor;
a first transparent conductive layer disposed on the first insulating layer, and the first transparent conductive layer comprising a pixel electrode;
a second insulating layer disposed on an upper side of the first insulating layer and an upper side of the first transparent conductive layer;
a connecting hole exposing a portion of the pixel electrode and a portion of the drain, a portion of the connecting hole passing through the second insulating layer, the portion of the pixel electrode being exposed at a bottom of the portion of the connecting hole, another portion of the connecting hole passing through the first insulating layer and the second insulating layer, and the portion of the drain being exposed at a bottom of the another portion of the connecting hole; and
a second transparent conductive layer disposed on the second insulating layer, the second transparent conductive layer comprising a common electrode and a connecting electrode, the common electrode being disposed on an upper side of the second insulating layer, at least a portion of the connecting electrode extending into the connecting hole, and the connecting electrode being electrically insulated to the common electrode;
wherein the connecting electrode is electrically connected to the drain and the pixel electrode, and at least a portion of a lower surface of the connecting electrode is in contact with the portion of the pixel electrode and the portion of the drain.

2. The pixel structure of claim 1, wherein the pixel electrode comprises a first portion and a second portion, the second portion overlaps the drain in a vertical projection direction, the first portion does not overlap the drain in the vertical projection direction, and the portion of the pixel electrode exposed at the bottom of the portion of the connecting hole is at least a portion of the second portion and a portion of the drain, wherein the vertical projection direction is perpendicular to a surface of the substrate.

3. The pixel structure of claim 1, wherein the portion of the connecting hole passing through the second insulating layer is a third portion, the another portion of the connecting hole passing through the first insulating layer and the second insulating layer is a fourth portion, and the third portion is situated at a side of the fourth portion.

4. The pixel structure of claim 3, wherein the connecting electrode comprises a fifth portion and a sixth portion, the fifth portion overlaps the third portion in a vertical projection direction, the sixth portion overlaps the fourth portion in the vertical projection direction, the fifth portion and the sixth portion are respectively in contact with the portion of the pixel electrode and the portion of the drain exposed by the connecting hole, wherein the vertical projection direction is perpendicular to a surface of the substrate.

5. The pixel structure of claim 4, wherein the fifth portion and the sixth portion are coupled to each other in the connecting hole.

6. The pixel structure of claim 5, wherein the pixel electrode is electrically connected to the drain through the fifth portion and the sixth portion of the connecting electrode.

7. The pixel structure of claim 4, wherein the connecting electrode further comprises a seventh portion and an eighth portion, the seventh portion and the eighth portion disposed in a region surrounding the connecting hole in the vertical projection direction, the seventh portion overlaps another portion of the pixel electrode in the vertical projection direction, and the eighth portion overlaps another portion of the drain in the vertical projection direction.

8. The pixel structure of claim 7, wherein the seventh portion is coupled to the fifth portion, the seventh portion is coupled to the eighth portion, and the eighth portion is coupled to the sixth portion.

9. The pixel structure of claim 8, wherein the pixel electrode is electrically connected to the drain through the fifth portion, the seventh portion, the eighth portion and the sixth portion of the connecting electrode.

10. The pixel structure of claim 1, wherein the portion of the connecting hole passing through the second insulating layer is a third portion, the another portion of the connecting hole passing through the first insulating layer and the second insulating layer is a fourth portion, and the third portion surrounds the fourth portion.

11. The pixel structure of claim 1, wherein the portion of the connecting hole passing through the second insulating layer is a third portion, the another portion of the connecting hole passing through the first insulating layer and the second insulating layer is and a fourth portion, and an area of the connecting hole is greater than or equal to twice an area of the third portion.

12. The pixel structure of claim 1, wherein the connecting hole is completely covered by the connecting.

13. The pixel structure of claim 12, wherein a portion of the connecting electrode overlaps the connecting hole in a vertical projection direction, and at least a portion of an edge of the connecting hole overlaps a portion of an edge of the connecting electrode in the vertical projection direction, wherein the vertical projection direction is perpendicular to a surface of the substrate.

14. The pixel structure of claim 12, wherein a portion of the connecting electrode overlaps the connecting hole in a vertical projection direction, edges of the connecting electrode are situated outside edges of the connecting hole in the vertical projection direction, and the edges of the connecting electrode do not overlap the connecting hole in the vertical projection direction, wherein the vertical projection direction is perpendicular to a surface of the substrate.

15. The pixel structure of claim 1, wherein the connecting hole is partially covered by the connecting electrode.

16. The pixel structure of claim 15, wherein a portion of edges of the connecting electrode is situated in the connecting hole in the vertical projection direction, wherein the vertical projection direction is perpendicular to a surface of the substrate.

17. The pixel structure of claim 1, wherein a projection area of the connecting electrode on a surface of the substrate is greater than a projection area of the connecting hole on the surface of the substrate.

18. The pixel structure of claim 1, wherein an undercut is located in a portion of the first insulating layer and is under the pixel electrode.

\* \* \* \* \*